(12) United States Patent
Maksimovic et al.

(10) Patent No.: US 7,315,270 B2
(45) Date of Patent: Jan. 1, 2008

(54) DIFFERENTIAL DELAY-LINE ANALOG-TO-DIGITAL CONVERTER

(75) Inventors: Dragan Maksimovic, Boulder, CO (US); Hao Peng, San Jose, CA (US)

(73) Assignee: The Regents of the University of Colorado, Denver, CO (US)

( * ) Notice: Subject to any disclaimer, the term of this patent is extended or adjusted under 35 U.S.C. 154(b) by 74 days.

(21) Appl. No.: 11/369,888

(22) Filed: Mar. 6, 2006

(65) Prior Publication Data

US 2006/0273831 A1 Dec. 7, 2006

Related U.S. Application Data

(60) Provisional application No. 60/658,768, filed on Mar. 4, 2005.

(51) Int. Cl.
H03M 1/60 (2006.01)
(52) U.S. Cl. ............... 341/157; 341/155; 341/166; 368/113; 368/120
(58) Field of Classification Search ........... 341/157, 341/166
See application file for complete search history.

(56) References Cited

U.S. PATENT DOCUMENTS

| 6,307,496 | B1 * | 10/2001 | Ikuta et al. .................. 341/155 |
| 6,429,693 | B1 * | 8/2002 | Staszewski et al. ............ 327/12 |
| 6,466,151 | B2 * | 10/2002 | Nishii et al. ................. 341/155 |
| 6,501,706 | B1 * | 12/2002 | West .......................... 368/118 |
| 6,850,178 | B2 * | 2/2005 | Watanabe ..................... 341/155 |
| 6,958,721 | B2 | 10/2005 | Vincent et al. |
| 7,061,292 | B2 * | 6/2006 | Maksimovic et al. ........... 327/277 |
| 7,205,924 | B2 * | 4/2007 | Vemulapalli et al. .......... 341/166 |

FOREIGN PATENT DOCUMENTS

WO  WO 03/050637  6/2003

OTHER PUBLICATIONS

Koga, Takashi, et al., "Dead Beat Control for PWM Inverter", IEEE, 1994, pp. 549-554, no month.
Sprock, Doug, et al., "Predictive Discrete Time Control of Switch-Mode Applications", IEEE, 1997, pp. 175-181, no month.
Bibian, Stephane, et al., "Digital Control with Improved Performance for Boost Power Factor Correction Circuits", IEEE, 2001, pp. 137-143, no month.
Bibian, Stephane, et al., "High Performance Predictive Dead-Beat Digital Controller for DC Power Supplies", IEEE, 2001, pp. 67-73, no month.
Kao, James T., et al., "A 175-mV Multiply-Accumulate Unit Using an Adaptive Supply Voltage . . . ", IEEE JSSC, Nov. 2002, 37(11):1545-1554.

(Continued)

Primary Examiner—Khai M. Nguyen
(74) Attorney, Agent, or Firm—Hensley Kim & Holzer, LLC

(57) ABSTRACT

Differential delay-line analog-to-digital (A/D) converters for use in current and power sensing applications are provided. These A/D converters are well suited for a wide range of electronic applications, including over-load protection, current mode control, current sharing in digitally controlled switched-mode power supplies, power sensing, and implementation of power optimization methods in power management applications.

43 Claims, 17 Drawing Sheets

OTHER PUBLICATIONS

Chen, Jingquan, et al., "Predictive Digital Current Programmed Control", IEEE TPE, Jan. 2003, 18(1):411-419.

Patella, B.J., et al., "High-Frequency digital PWM controller IC for DC-DC converters", IEEE TPE, Jan. 2003, 18(1):438-446.

Peterchev, Angel V., et al., "Architecture and IC Implementation of a Digital VRM Controller", IEEE TPE, Jan. 2003, 18(1):356-364.

Peterchev, Angel V., et al., "Quantization Resolution and Limit Cycling in Digitally Controlled PWM Converters", IEEE TPE, Jan. 2003, 18(1):301-308, no month.

Maksimovic, Dragan, et al., "Impact of Digital Control in Power Electronics", Intl' Symposium on Power Semiconductor Devices & ICs, 2004, pp. 13-22, no month.

Peng, Hao, et al., "Modeling of Quantization Effects in Digitally Controlled DC-DC Converters", IEEE PESC, 2004, pp. 4312-4318, no month.

Peterchev, Angel V., et al., "Digital Loss-Minimizing Multi-Mode Synchronous Buck Converter Control", IEEE PESC, 2004, pp. 3694-3699, no month.

Zhang, Yang, et al., "On-Line Calibration of Lossless Current Sensing", IEEE, 2004, pp. 1345-1350, no month.

Peng, Hao, et al., "Digital Current-Mode Controller for DC-DC Converters", IEEE, 2005, pp. 899-905, no month.

* cited by examiner

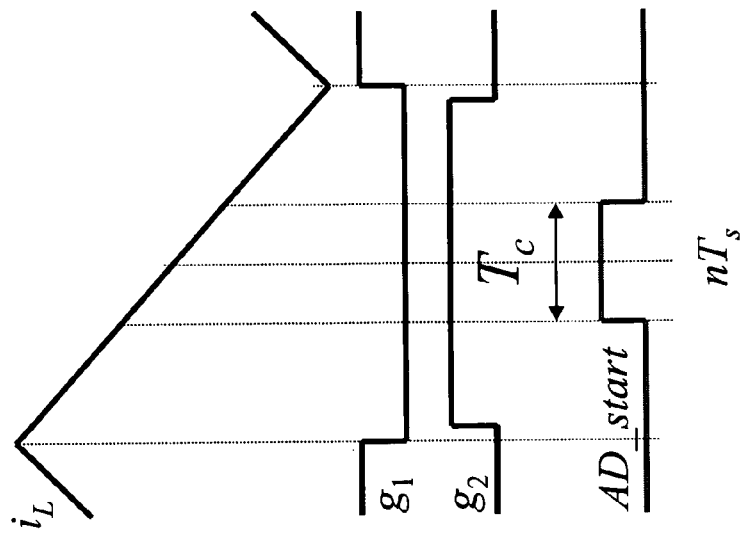
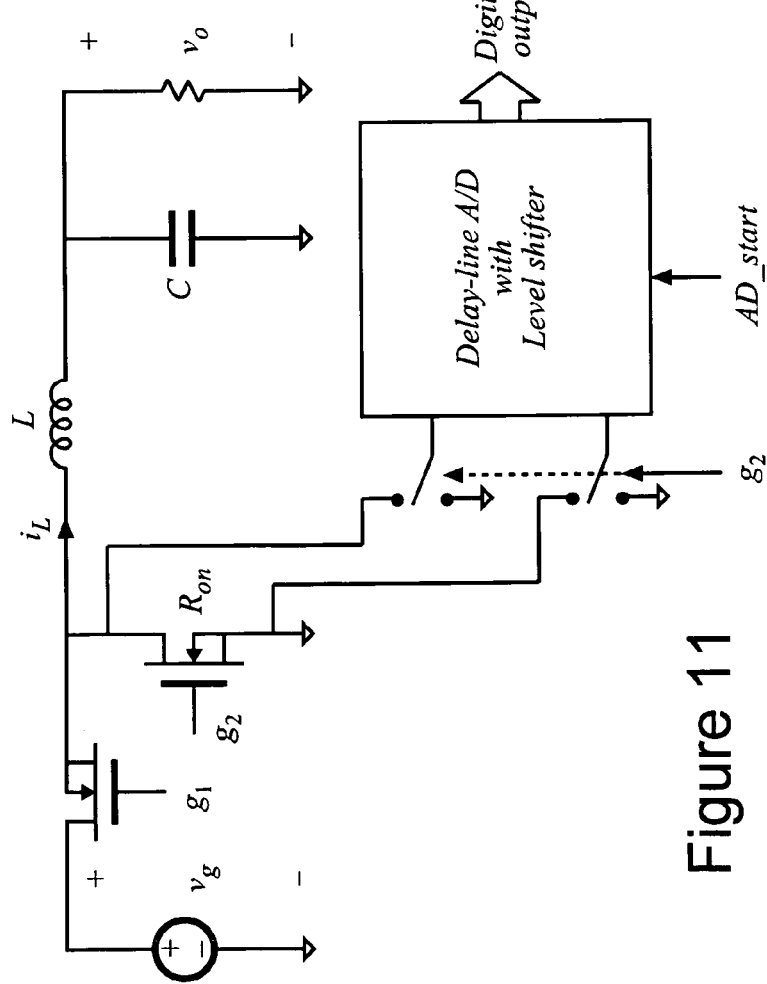
Figure 11
Figure 12

DIFFERENTIAL DELAY-LINE ANALOG-TO-DIGITAL CONVERTER

CROSS-REFERENCE TO RELATED APPLICATIONS

This application claims the benefit of U.S. provisional application No. 60/658,768 entitled "Differential Delay-line A/D Converter and Applications" and filed by Dragan Maksimovic et al. on 4 Mar. 2005, which is hereby incorporated by reference as though fully set forth herein.

BACKGROUND OF THE INVENTION

1. Field of the Invention

The instant invention relates to differential delay-line analog-to-digital converters for use in current and power sensing applications.

2. Background

Current sensing is required in a wide range of electronics applications, such as in power electronics and power management applications. In such applications, current sensing can be performed for many purposes such as the following: overload protection for electronic modules, such as switched-mode power supplies; current sharing in paralleled electronic modules, such as switched-mode power supplies; controlling a current in a module to track a specific reference value; monitoring current or power consumption of an electronic module, such as switched-mode power supplies or digital VLSI devices (e.g., microprocessors).

BRIEF SUMMARY OF THE INVENTION

In power electronics and power management applications, for example, rapid advances in digital VLSI technology have made digital implementation techniques increasingly important and desirable. Thus, there exists a strong need for circuits capable of sensing current or power and converting that sensed signal to a digital form. Features of such current or power sensing include at least some of the following: an ability to perform the sensing operation without incurring additional power losses in the module where the current or power is sensed; scalability of performance in terms of conversion time and resolution with advances in digital VSLI technology; an ability to trade-off resolution for conversion time; a realization based on digital logic gates; immunity to noise; low power consumption; and small area for implementation.

Differential delay-line analog-to-digital (A/D) converters for use in current and power sensing applications are provided. These A/D converters are well suited for a wide range of electronic applications, including over-load protection, current mode control, current sharing in digitally controlled switched-mode power supplies, power sensing, and implementation of power optimization methods in power management applications.

In one embodiment, a method of converting an analog input signal to an output digital current value is provided. The method comprises: receiving a first input voltage and a second input voltage, in which the first and second analog input voltage levels collectively represent a current; applying the first input voltage to a first delay line comprising a plurality of delay cells; applying the second input voltage to a second delay line comprising a plurality of cells, wherein the first and second delay lines are matched; propagating a signal through the first delay line and the second delay line; tapping a plurality of output signals of a corresponding plurality of delay cells of the first and second delay lines; and generating a digital output of the current represented by the first and second analog input voltage levels based upon the plurality of output signals.

In one implementation of the method, the method further comprises biasing the first analog input voltage and/or the second analog input voltage. The first analog input voltage and/or the second analog input voltage, for example, may be biased by level shifting or scaling the voltage. The first analog input voltage and/or the second analog input voltage may also be gated. For example, the first analog input voltage and/or the second analog input voltage may be gated synchronously with an on-time of a sampling transistor. In one implementation, a conversion time is approximately centered within the on-time of the sampling transistor.

In another embodiment, an analog-to-digital converter is provided. The analog-to-digital converter comprises a source of a first input voltage and a source of a second input voltage. The first input voltage and the second input voltage collectively represent a current. The converter further comprises a primary delay line connected to the source of a first input voltage, a secondary delay line connected to the source of a second input voltage, a signal source, and a digital output circuit. The primary delay line comprises a delay signal input and a plurality of tap outputs, and the timer delay line comprises a timer signal input and a timer signal output. The signal source is connected to the delay signal input and the timer delay signal input. The digital output circuit is coupled to the tap outputs and the timer signal output to provide a digital output indicative of the current represented by the first input voltage and the second input voltage.

In another embodiment a power-sensing analog-to-digital converter is provided. The converter comprises a source of a first input voltage, a source of a second input voltage, a primary ring oscillator connected to the source of the first input voltage, a secondary ring oscillator connected to the source of a second input voltage, a clock counter, a reference counter, a sense counter, a register, and a controller. The clock counter is connected to a first clock to provide a clock count based upon the first clock. The reference counter is connected to the primary ring oscillator to provide a reference count, and the sense counter is connected to the secondary ring oscillator to provide a sense count. The register is provided to store a first count and a second count. The controller is configured to perform the following operations: reset the clock counter, the reference counter, and the sense counter; store the reference count as the first count in the register when the sense clock reaches a first predetermined value; store the reference clock as the voltage count in the register when the count reaches a second predetermined value; subtract the first predetermined value from the first count to provide a current count; and digitally multiply the current count and the voltage count to provide a power value.

In one embodiment, a differential delay-line analog-to-digital converter comprises a pair of matched delay-lines driven by scaling and offset circuits that interface to a current-sensing resistance. The current sensing resistance, for example, may comprise a power distribution wire or transmission line, a purposely added sense resistor, or an on-resistance of a power transistor. Scaling and offset results can be adjusted to effect trade-offs between conversion time and resolution of the converter. In one embodiment, digital CMOS technology is used to provide scalable components of the analog-to-digital converter.

The foregoing and other aspects, features, details, utilities, and advantages of the present invention will be apparent from reading the following description and claims, and from reviewing the accompanying drawings.

BRIEF DESCRIPTION OF THE DRAWINGS

FIG. 11 shows a block diagram of an exemplary current-sensing differential delay-line A/D converter application.

FIG. 12 shows exemplary waveforms of control signals utilized in the application shown in FIG. 11.

DETAILED DESCRIPTION OF THE INVENTION

Matched Voltage-Sensing Delay-Line A/D Converter

Figure 1:
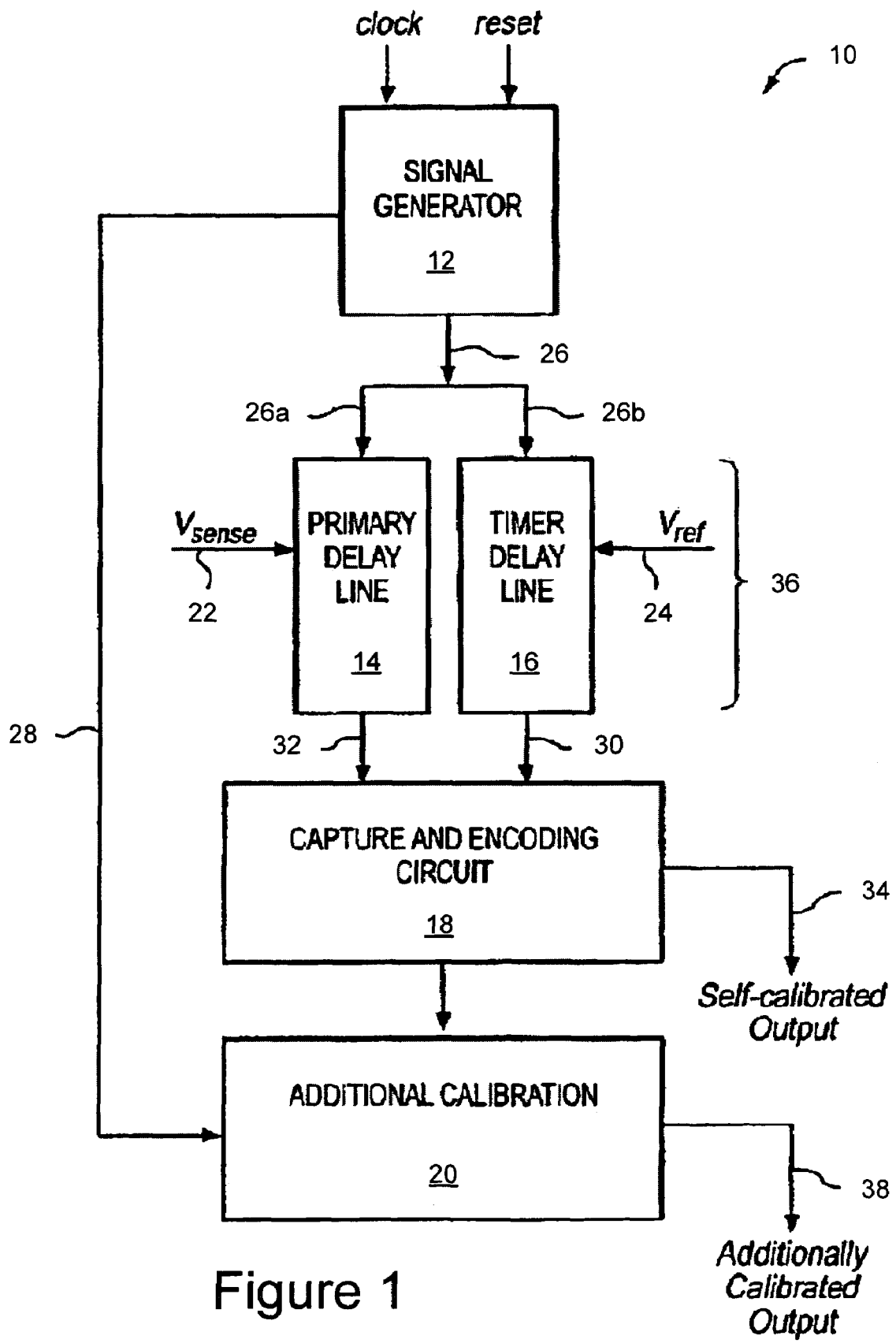
FIG. 1 shows a block diagram of an exemplary matched delay-line A/D converter.

FIG. 1 shows an exemplary system-level block diagram of a matched delay-line analog-to-digital (A/D) converter system 10. The converter system 10 includes a signal generator 12, a primary delay line 14, a timer delay line 16, a capture and encoding circuit 18 and an additional calibration circuit 20. In this embodiment, the primary delay line 14 is powered by an analog input signal $V_{sense}$ received via line 22. The timer delay line 16 is powered by a reference voltage signal $V_{ref}$ received via line 24. The signal generator 12 provides a signal on line 26 which, in one embodiment, serves as a source for both a delay signal on delay signal input 26a directed to the primary delay line 14 and a timer signal on timer signal input 26b directed to the timer delay line 16. The delay signal and the timer signal, however, may be independent signals received from the signal generator 12 or from different signal generators. The signal generator 12 also applies a calibration signal on line 28 to the additional calibration circuit 20. Upon the propagation of the timer signal through the timer delay line 16, a strobe signal is provided on timer signal output 30 which, in one embodiment, enables the capture and encoding circuit 18 to capture the output of the primary delay line 14 on tap outputs 32, and thus determine a signal propagation distance (i.e., the distance (e.g., a number of delay cells) the delay signal has propagated through the primary delay line 14 in the time it took the timer signal to propagate through timer delay line 16). This distance is proportional to the input voltage $V_{sense}$. The capture and encoder circuit 18 then outputs a digital signal representative of the magnitude of the analog voltage $V_{sense}$ on an output 34, thus converting the analog signal to a digital signal. The output 34 is self-calibrated in that the matched delay line system 36 automatically calibrates the output for temperature and process variations.

Though the matched delay line structure provides a self-calibrated reference point over temperature and process variations, it is possible that the step-size of the A/D characteristic will change with process and temperature. The additional calibration block 20 uses the value of a counter associated with the timer delay line 16, which counter is latched for a fixed time after the input pulse is sent down the line. If there are process or temperature variations that would affect the step-size of the AND characteristic, they show up in the form of a variation in this count from what it is under typical process and temperature conditions. The calibration block 20 takes this latched count value along with the uncalibrated output code as inputs. It then compares the latched count to known process corners, and outputs a calibrated code on output 38 according to the process or temperature corner dictated by the count. In one embodiment, the output of this block comprises a two's compliment binary representation of the sensed voltage. If a two's compliment is unacceptable, this block can also re-encode the output to the desired format. For instance, the output can be addresses associated with a look-up table which creates codes in ascending order starting at zero, corresponding to one end of the A/D characteristic.

In this disclosure, the term "analog devices" include passive components such as resistors, inductors, and capacitors, and transistor-based devices operating in their gain stages. The term "analog components" is used interchangeably with the term "analog devices". The term "delay signal" refers to a signal propagating through the primary delay line 14, while the term "timer signal" refers to a signal propagating through the timer delay line 16. The term "digital logic gates" include AND, NAND OR, and NOR gates and other active electronic components providing discrete logic-1 or logic-0 output states.

Figure 2:
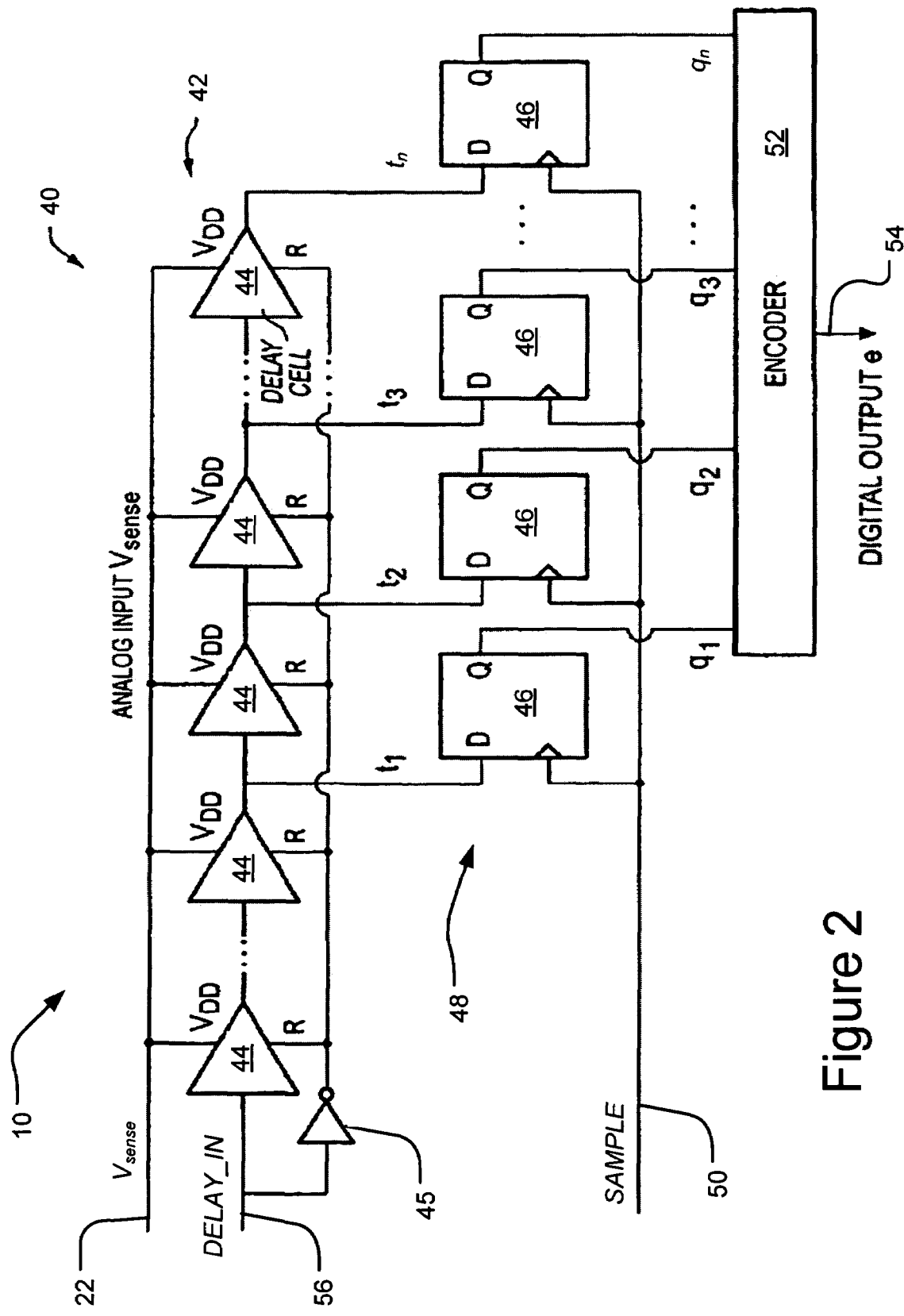
FIG. 2 shows schematic diagram of an exemplary delay-line A/D converter.

FIG. 2 is a block diagram of an exemplary basic delay line A/D converter 40, as disclosed in PCT published application PCT/US02/39189 filed Dec. 9, 2002, which is hereby incorporated by reference to the same extent as though fully disclosed herein. In this embodiment, the A/D converter 40 includes a delay cell array 42 comprising a plurality of delay cells 44 connected in series. In one possible implementation, the delay cells 44 comprise digital logic gates. A DELAY_IN signal is applied to the input of the first delay cell 44 and also to the input of an inverter 45, the output of which applies a reset signal R to the reset input of each of delay cells 44. Taps $t_1, t_2, t_3 \ldots t_n$ are connected to the outputs of the delay cells 44 beyond a predetermined number of cells. The taps $t_1, t_2, t_3 \ldots t_n$ are connected to D inputs of corresponding flip-flops 46 in a flip-flop array 48. A SAMPLE signal on line 50 is applied to the clock inputs of flip-flops 46. The Q outputs of each of the flip-flops 46 in the array 48, providing output signals $q_1, q_2, q_3 \ldots q_n$, are connected to an encoder 52. An output 54 of the encoder 52 provides a digital error signal e.

The A/D converter 40 operates on the principle that signal propagation speed varies substantially proportionately with supply voltage $V_{DD}$ applied to the delay cells. In the embodiment of FIG. 2, an analog input signal $V_{sense}$ is applied to $V_{DD}$, the supply voltage to delay cells 44, on line 22. At the beginning of a switching cycle, a DELAY_IN pulse is applied to line 56 connected to the input of the first delay cell 44 to cause a delay signal to propagate through delay cell array 42. After a predetermined conversion-time interval taps $t_1, t_2, t_3 \ldots t_n$ are sampled. In one implementation, for example, the conversion-time interval comprises about three-quarters of the sampling period of the SAMPLE signal. The result of this sampling is temporarily stored in the flip-flop array 48 and then transmitted to the encoder 52 via the flip-flop output array 48. The outputs $q_1, q_2, q_3 \ldots q_n$ coupled to the encoder 52, in one embodiment, are in the form of a "thermometer code." In this embodiment, the encoder 52 converts the thermometer code into digital output "e" 54. The digital output 54, for example, may comprise any digital form, such as a digital form more suitable for use in a data processing apparatus than the thermometer code outputs $q_1, q_2, q_3 \ldots q_n$. It will be appreciated that the encoder 52 may provide the digital output 54 in a wide range of digital data formats.

The lower the value of the analog input voltage signal $V_{sense}$, the longer the cell delay $t_d$, and the delay pulse propagates to fewer taps. The higher the value of the analog input voltage signal $V_{sense}$, the shorter the cell delay $t_d$, and the delay pulse propagates to more taps. Accordingly, the extent of the propagation of the delay pulse 56, within a fixed time period, provides a measure of the magnitude of $V_{DD}$ (the analog input voltage signal $V_{sense}$ in some embodiments).

In the embodiment of FIG. 2, the length of delay cell array 42 effectively determines a reference value, $V_{ref}$, on which the A/D converter 40 conversion characteristic is centered. The number of taps and the tap delay preferably determine the range $(\Delta V_{DD})_{max}$ and the effective least significant bit (LSB) resolution $\Delta V_{DD}$ of the A/D converter 40. In one embodiment, for example, the delay line is established so that the LSB resolution of $\Delta V_{DD}=40$ mV, and the reference voltage, $V_{ref}$, is 2.5V. In this embodiment, digital output e on line 54 is a digital representation of the difference between the measured voltage, $V_{sense}$, and a reference voltage (not shown). Thus, when $V_{sense}$ equals $V_{ref}$, digital output e has a value of zero.

An important-advantage of the delay-line A/D converter 40 is noise immunity. One contributing factor to this immunity is the averaging of $V_{sense}$ over the time period during which delay pulse propagation is measured. Another factor is the relative immunity of the thermometer code output to noise spikes.

In the embodiment of FIG. 2, the value of $V_{ref}$ is indirectly determined by the length of delay cell array 42 and the delay-versus-voltage characteristic of delay cells 44. Significantly, the disparity between $V_{sense}$ and $V_{ref}$ is determined by the A/D converter 40 without employing an analog comparator. Accordingly, the burdens of increased power consumption, high space requirements, and dependency on the degree of precision of analog component design are beneficially avoided in the embodiment of FIG. 2.

In practice, because of process and temperature variations, the reference voltage, $V_{ref}$, provided by the A/D converter 40 can be difficult to precisely control. Variations in temperature and in the process conditions of delay cells 44 may cause signal propagation delay in delay cell array 42 to fluctuate independently of $V_{sense}$. The resulting variations in $V_{ref}$ generally may cause variations in the value of digital output e on line 54 for a given value of $V_{sense}$. Accordingly, it may be desirable to control and/or eliminate the effects of temperature and process conditions on the value of digital output e.

In some embodiments, the problems of temperature and process condition-induced influence over signal propagation speed through delay cells can be addressed by varying the duration of the sampling period, during which a delay pulse signal propagates through an array of delay cells. In the exemplary delay line A/D converter 40 of FIG. 2, measurement of signal propagation distance, or extent, within a predetermined time period effectively measures the effects of three variables on such signal propagation distance while attributing this signal propagation distance to just one of the variables. Specifically, variation in signal propagation speed depends on variation in supply voltage to the delay cells, temperature, and process conditions.

In other embodiments, the duration of the first sampling period during which signal propagation distance is measured through a primary delay line is varied with temperature and process conditions. The sampling period is preferably varied to the same degree but in the opposite direction, as is the signal propagation speed through the primary delay line. In this way, temperature and/or process condition effects which increase the propagation speed by, for example, 10% (over a baseline set of initial conditions), preferably decrease the sampling period by this same proportion, thereby yielding the same signal propagation distance for an unchanged supply voltage to the delay cells of the primary delay line.

A common DELAY_IN signal on line 56 can be directed both to a primary delay line 14 and to a timer delay line 16 (FIG. 1). The timer delay line in some embodiments has a length equal to some fraction of the length of the primary delay line and is manufactured on the same chip as the primary delay line, thereby causing both delay lines to experience all the same process conditions. Moreover, in these embodiments, the timer delay line is located in the same environment as the primary delay line and therefore preferably experiences substantially identical temperature conditions.

U.S. Pat. No. 6,958,721 entitled "Matched Delay Line Voltage Converter" issued to Vincent et al. on Oct. 25, 2005 describes these and other embodiments of matched delay line voltage A/D converters, which is incorporated by reference to the same extent as if fully disclosed herein.

Voltage-Sensing Differential Delay-Line A/D Converter

Figure 3:
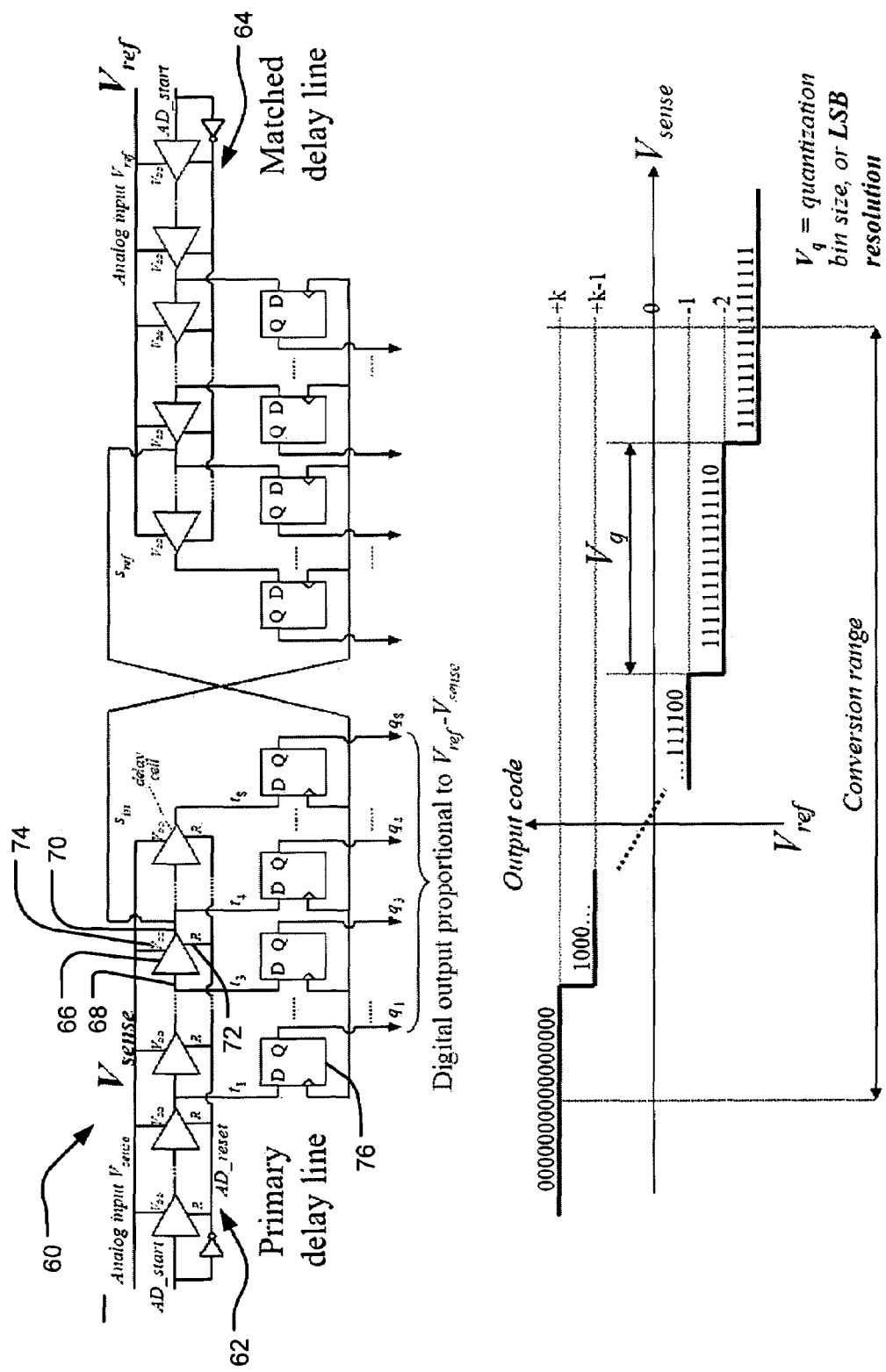
FIG. 3 shows a block diagram of an exemplary matched differential delay-line A/D converter.

FIG. 3 shows a block diagram of another exemplary differential delay-line A/D converter 60 that determines a difference between two analog input voltage signals. As shown in FIG. 3, the differential delay-line A/D converter 60 comprises a pair of matched delay lines 62, 64. A first delay line 62 receives an analog input voltage signal $V_{sense}$, and a matched second delay line 64 receives an analog reference voltage signal $V_{ref}$ (or may comprise a second measured analog input voltage signal). The first delay line is powered by the analog input voltage $V_{sense}$, and the matched second delay line 44 is powered by the analog reference voltage signal $V_{ref}$. In this implementation, a digital output code of the first delay line 62 is at least substantially proportional to the difference between the analog input voltage signal and the analog reference voltage signal (e.g., $V_{sense}-V_{ref}$).

As described above, the first analog input voltage signal $V_{ref}$ is applied as a supply voltage across a plurality of individual delay-cells 66 of the first delay line 62 arranged in a series delay-line configuration. Schematic diagrams of exemplary delay cells are disclosed and described in U.S. Pat. No. 6,958,721 and PCT published patent application number PCT/US02/39189, which were previously incorporated by reference. Each of the individual delay cells 66 comprises an input 68, an output 70, a reset input R 72, and a supply voltage input $V_{DD}$ 74. The output 70 of each delay cell is coupled to the input 68 of the next delay cell in the series. The analog input voltage $V_{sense}$ is applied to the supply voltage input $V_{DD}$ 74 of each delay cell 66 of the first delay line 42, and the reference voltage signal $V_{ref}$ is applied to the supply voltage input $V_{DD}$ of each delay cell of the second delay line 64. A delay signal AD_start is applied to the input 68 of the first delay cell of both the first delay line 62 and the second delay line 64. A reset signal AD_reset can also be applied to the reset input 72 of each delay cell 68 to reset the output of the delay cells to zero. Although the reset signal AD_reset is shown as an inverted version of the delay signal, the reset signal AD_reset may alternatively be an independent signal or generated from the delay signal in another manner.

In operation, the delay signal AD_start is applied to the input of the first delay cell of both delay lines 62, 64 and propagates through the series of delay cells until the AD_reset signal resets each of the delay cells. Upon the propagation of the delay signal AD_start through the second delay line 64, a strobe signal provided on the timer output signal $S_{ref}$. The strobe signal enables the flip-flop array to capture the output of the first delay line 62 on tap outputs $t_1, t_2 \ldots t_n$ and to output a digital value on an output $q_1, q_2 \ldots q_n$. The outputs $q_1, q_2 \ldots q_n$ will comprise a predetermined digital level if the clock signal AD_start had propagated through a delay cell 66 corresponding to a particular flip-flop 76 by the expiration of the predetermined conversion-time interval. Thus, if the clock signal AD_start had propagated through half (i.e., four) of eight tapped delay cells the digital output by the time the strobe_in signal was issued, eight output levels $q_1, q_2 \ldots q_8$ could comprise a digital "thermometer code" of "11110000." The thermometer code then can be applied to an encoder that converts it to a digital value.

As described above, the delay of each individual delay cell 66 is approximately inversely proportional to the supply voltage $V_{DD}$ being applied to the delay cell 66 where that voltage is greater than a threshold voltage $V_{th}$ of a device of the delay cell (e.g., a CMOS device). Thus, the delay of each cell is roughly inversely proportional to the sampled analog voltage signal received by the A/D converter 60 and the output "thermometer code" can be used to determine a digital output signal converted from and corresponding to the received analog input voltage.

Current-Sensing Differential Delay-Line A/D Converters

Figure 4:
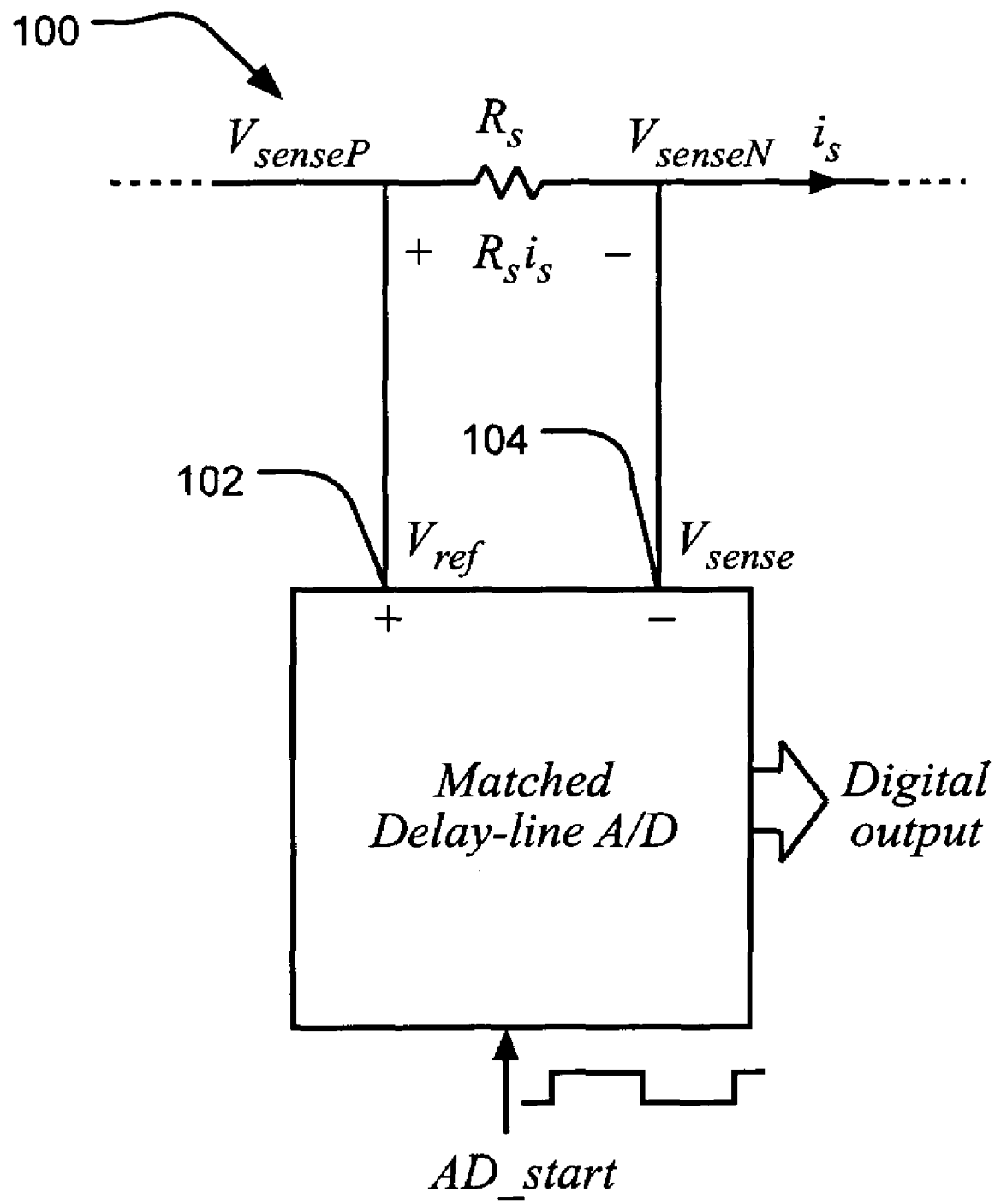
FIG. 4 shows a block diagram of an exemplary matched current-sensing differential delay-line A/D converter.

FIG. 4 shows a block diagram of an exemplary current sensing differential delay-line A/D converter 100. As shown in FIG. 4, the converter 100 comprises a pair of inputs 102, 104 connected across a sense resistor $R_s$ through which a current to be sensed is flowing. The first input 102 of the matched differential delay-line A/D converter 100 corresponds to the $V_{sense}$ input shown in FIG. 3, and the second input 104 corresponds to the $V_{ref}$ input. The difference between the voltage $V_{senseP}$ at the first input 102 and the voltage $V_{senseN}$ at the second input 104 (e.g., $V_{sense}-V_{ref}=V_{senseP}-V_{senseN}$) of the converter 100 is equal to the voltage drop across the sense resistor $R_s$ (i.e., $R_s \cdot i_s$). Where the resistance of the sense resistor $R_s$ is small, the voltage $V_{senseP}$ at the first input 102 is approximately equal to the voltage $V_{senseN}$ at the second input 104 (i.e., $V_{senseP} \approx V_{senseN}$). The sense resistor $R_s$, for example, may comprise a resistor added to facilitate current sensing, a resistance of a wire or transmission layer carrying the sense current, or an on-resistance of a switch carrying the sense current.

Figure 5:
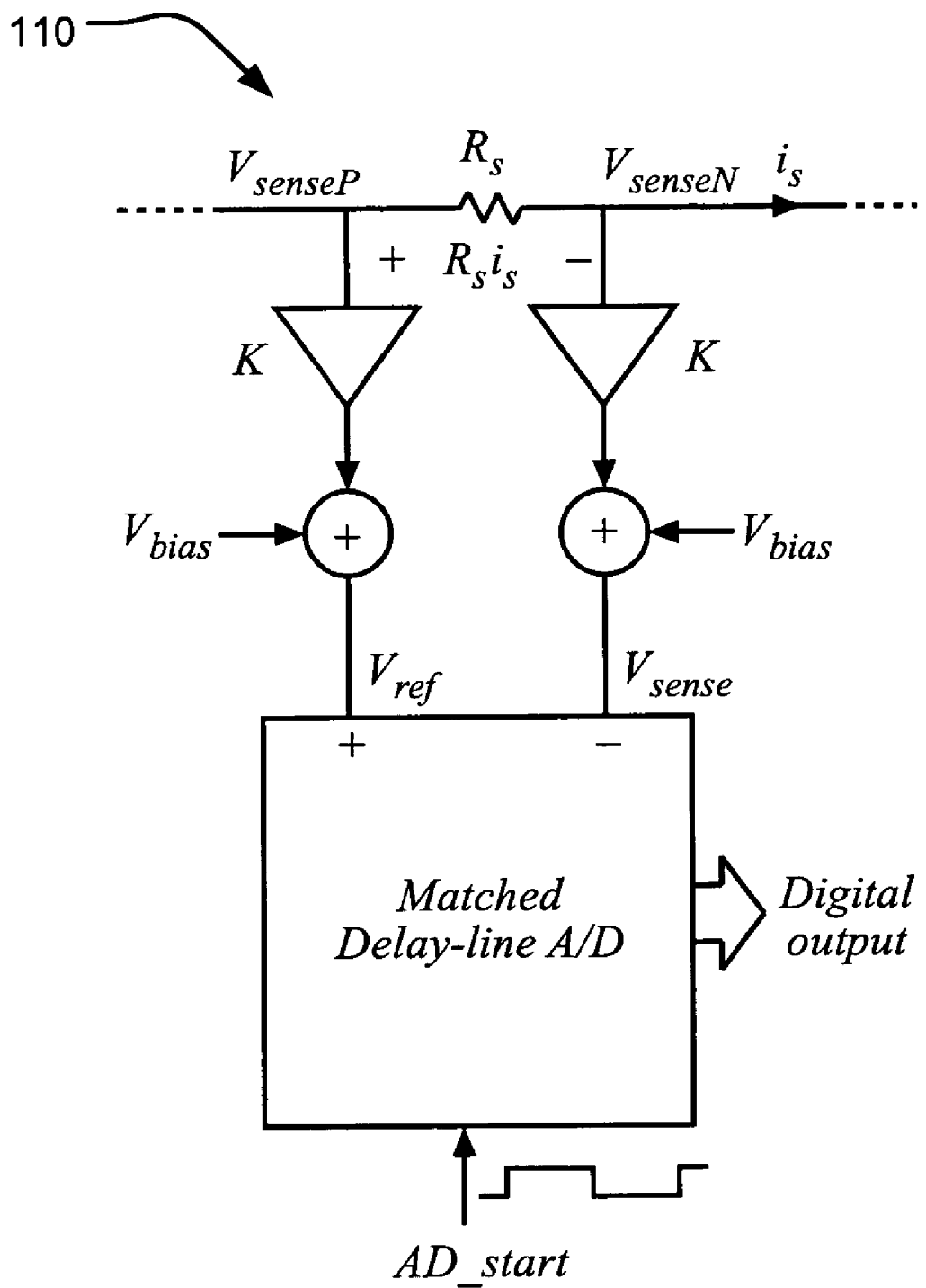
FIG. 5 shows a block diagram of another exemplary current-sensing differential delay-line A/D converter.

FIG. 5 shows a block diagram of another exemplary current sensing differential delay-line A/D converter 110. As shown in FIG. 5, the sensed voltages $V_{senseP}$ and $V_{senseN}$ received at the A/D converter 110 pass through an analog scaling amplifier and/or a level shifter before being applied to the differential delay-line A/D converter 110. Although FIG. 5 shows the analog amplifiers and level shifters as being external to the A/D converter 110, the A/D converter may comprise amplifiers and/or level shifters within the A/D converter.

The matched delay-line A/D converter 110 operates better over a restricted range of input voltages $V_{ref} \approx V_{sense}$, which may or may not be the same as the voltages at the sense point, $V_{senseP} \approx V_{senseN}$. Analog scaling and/or level shifting, for example, may be used to adjust the operating voltages of the matched delay-line A/D converter 110. Adjustment circuitry, such as the analog scaling and/or level shifting circuitry shown in FIG. 5, may be implemented, for example, by using matched resistive voltage dividers, matched analog amplifiers (e.g., source followers), and/or voltage drops across matched semiconductor devices (e.g., diodes or diode-connected MOS devices).

Figure 6:
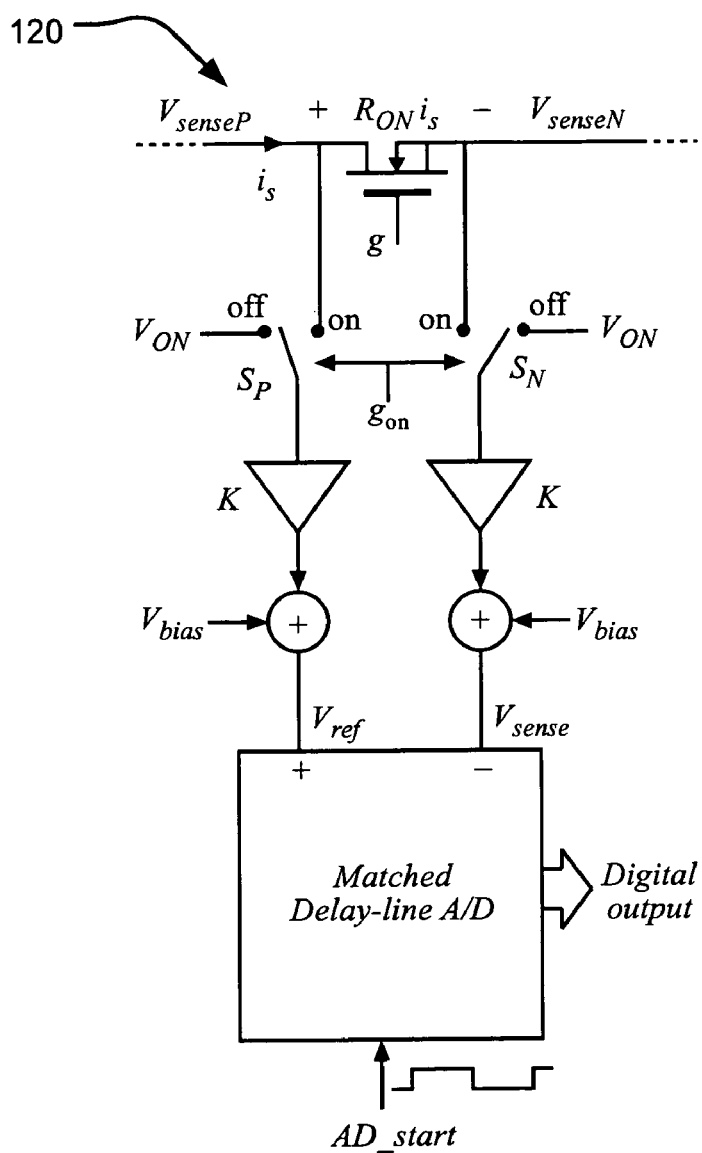
FIG. 6 shows a block diagram of yet another exemplary current-sensing differential delay-line A/D converter.
Figure 7:
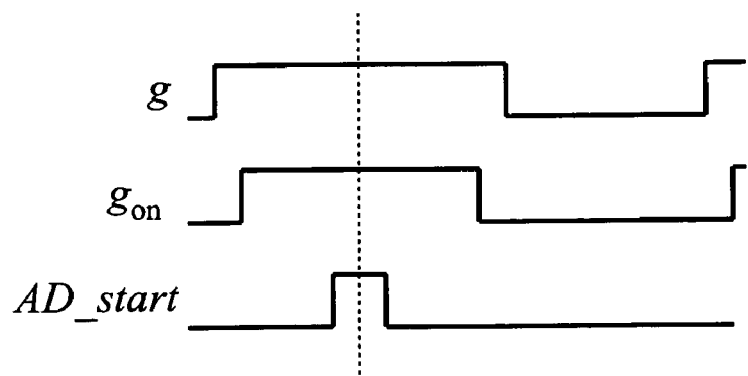
FIG. 7 shows exemplary timing waveforms for current-sensing between switching transitions of a power switch.

FIG. 6 shows a block diagram of yet another exemplary current-sensing differential delay-line A/D converter 120. As shown in FIG. 6, the differential delay-line A/D converter 120 senses voltage across an on-resistance ($R_{ON}=R_s$) of a transistor, such as a power switch, which can be a desirable current-sensing technique in a switched-mode power supply, for example. Additional gating switches $S_N$ and $S_P$ operated in synchronism with the power switch protect the current sensing A/D converter from high off-switch voltages and associated voltage transients. The voltages $V_{ON}$ used to control the gating switches, for example, can be selected to be close to the sensed voltages $V_{senseP} \approx V_{senseN}$ when the power switch is ON. Exemplary timing waveforms are shown in FIG. 7 for current-sensing in the middle of the power switch on-time, which reduces noise generated by the switching of the power switch.

Conversion Time and Resolution

In one embodiment of a differential delay-line A/D converter, the converter may be designed to trade off resolution in favor of conversion time or conversion time in favor of resolution, or the converter may be designed to select a compromise between resolution and conversion time. In a current-sensing differential delay-line A/D converter, for example, a least significant bit (LSB) resolution is $I_q=V_q/(KR_s)$. Where the number of delay cells in each delay line of the converter is N, for example, the cell delay as a function of the supply voltage is $t_d=t_d(V_{DD})$, where $t_d(V_{DD})$ represents that $t_d$ is a function of the supply voltage $V_{DD}$. If $V_{sense}=V_{ref}-V_q$, $(N-1)\cdot t_d(V_{sense})=N\cdot t_d(V_{ref})$, and $(N-1)\cdot t_d(V_{ref}-V_q)=N\cdot t_d(V_{ref})$. By linearizing, $$(N-1)\left[t_d(V_{ref}) - \frac{\partial t_d(V_{DD})}{\partial V_{DD}} V_q\right] \approx N t_d(V_{ref}),$$

$$\text{and } -N\frac{\partial t_d(V_{DD})}{\partial V_{DD}} V_q \approx t_d(V_{ref}).$$

Thus, for the minimum conversion time $T_c$, as a function of the LSB resolution $V_q$, the cell delay $t_d$, and the slope of the cell delay as a function of the supply voltage is as follows:

$$T_c = N t_d = \frac{t_d^2}{|\partial t_d / \partial V_{DD}|}(1/V_q).$$

Figure 8:
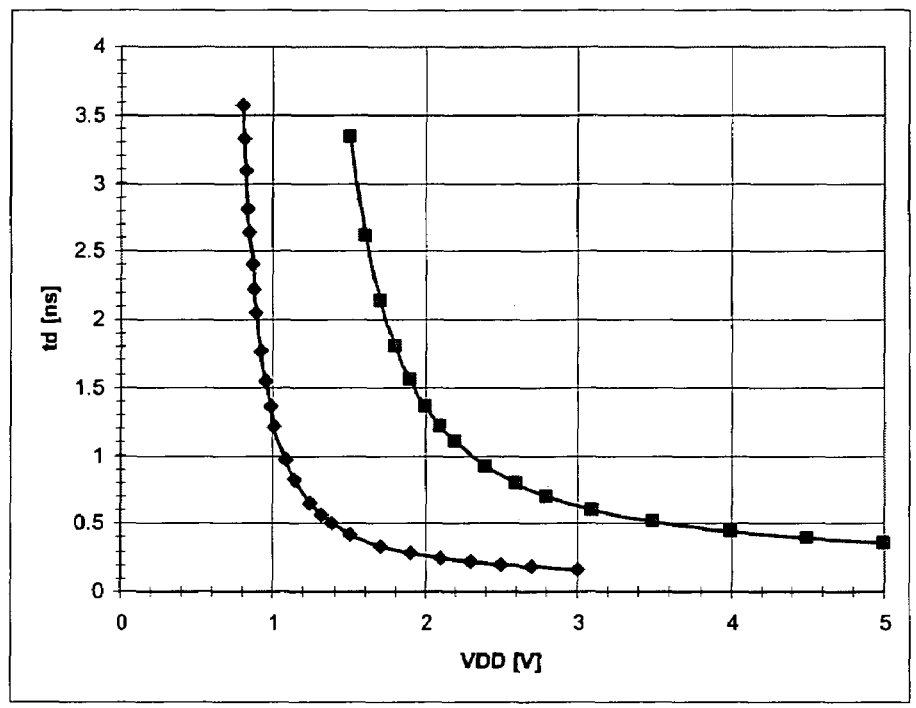
FIG. 8 shows exemplary simulated graphs of a cell delay $t_d$ of a converter as a function of the supply voltage.
Figure 9:
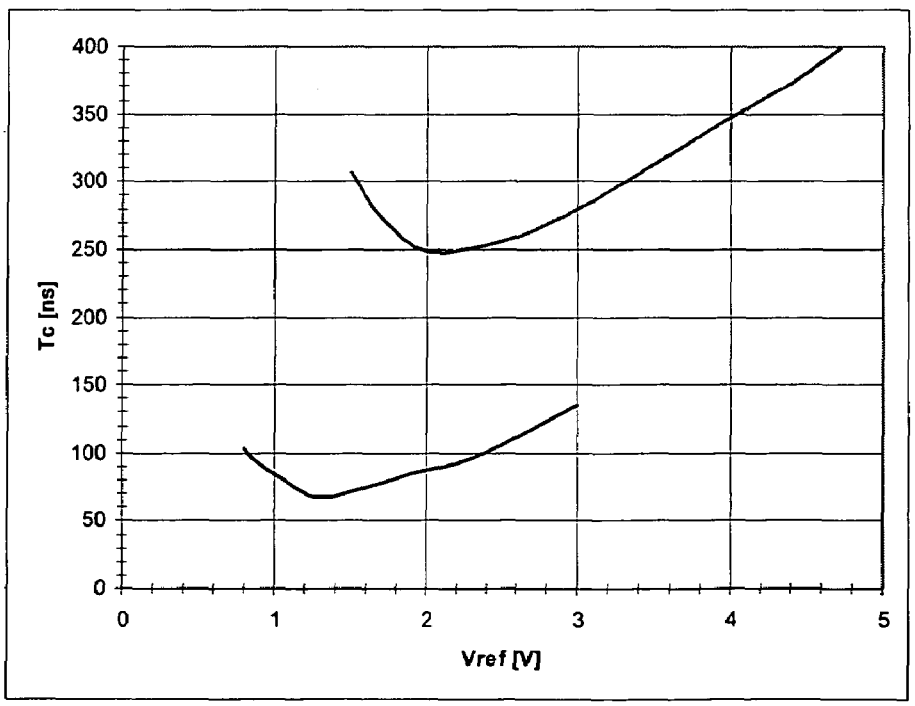
FIG. 9 shows exemplary simulated graphs of a conversion time $T_c$.

FIG. 8, for example, shows simulated graphs of a cell delay $t_d$ of a converter as a function of the supply voltage $V_{DD}$ applied to the delay cells for converters using 0.35µ and 0.8µ CMOS integrated circuit technologies, respectively. FIG. 9 shows a simulated graph of a conversion time $T_c$ of the converters shown in FIG. 8 as a function of the reference voltage $V_{ref}$ for a LSB resolution $V_q=5$ mV. As can be seen in FIG. 9, a minimum value of the conversion time $T_c$ function can be arrived at by selecting a corresponding reference voltage level $V_{ref}$ for a particular IC technology. For the 0.8µ embodiment, for example, a reference voltage level $V_{ref}=2$ V corresponds to a LSB resolution $V_q=5$ mV, a conversion time $T_c=250$ ns, and a number of cells N=181 cells. For the 0.35µ embodiment, however, a reference voltage level $V_{ref}=1.3$ V corresponds to a LSB resolution $V_q=5$ mV, a conversion time $T_c=67$ ns, and a number of cells N=226 cells. Thus, the sensed voltage levels $V_{senseP}$ and $V_{senseN}$ can be adjusted, such as through analog scaling or level shifting, to trade off conversion time versus resolution.

Figure 10:
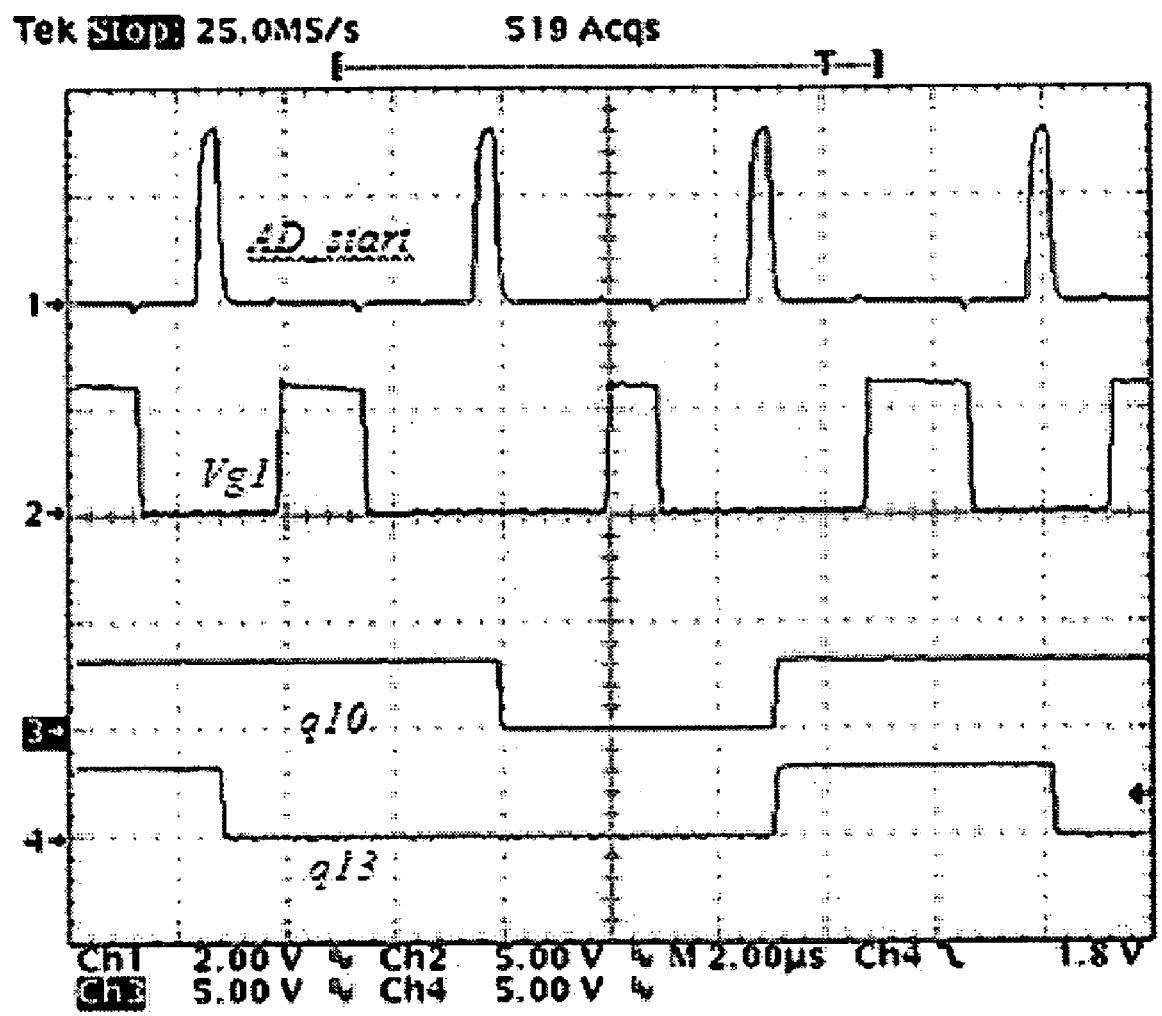
FIG. 10 shows exemplary waveforms for an operation of an A/D converter sensing a current flowing through an on-resistance of a transistor.

FIG. 10 shows waveforms for an operation of the A/D converter sensing a current flowing through an on-resistance of a transistor, such as a power switch, for time varying duty cycles. As shown in FIG. 10, the clock signal AD_start is generated during the switch off-time (e.g., at about the middle of the off-time) to reduce the likelihood of noise being generated during the switching of the transistor. In addition, the digital outputs change values after the conversion time $T_c$.

The differential A/D converter design can be implemented almost entirely in a digital-based logic topology providing for relatively low power consumption, small chip area, and low sensitivity to noise. Such a design scales well with digital technology. For example, in a 0.35µ CMOS topology, a conversion time $T_c$ for a given LSB resolution (e.g., about 5 mV) of about four times faster than the conversion time $T_c$ of a corresponding converter implemented in a 0.8µ CMOS topology can be achieved.

Exemplary Current-Sensing Application

FIG. 11 shows a block diagram of an exemplary current-sensing differential delay-line A/D converter application in which the A/D converter is used to sense the voltage across an on-resistance of a synchronous rectifier switch of a switched-mode power converter. As shown in FIG. 11, the positive (+) and negative (–) inputs of the converter are connected to the drain and source of the synchronous rectifier switch via a pair of gating switches, respectively. As described above with respect to FIG. 6, the pair of gating switches is controlled via a control signal g2 to operate in synchronism with the synchronous rectifier switch in order to protect the current-sensing A/D converter from high off-switch voltages and associated voltage transients.

FIG. 12 shows waveforms of control signals utilized in the application shown in FIG. 11. As shown in FIG. 12, the conversion time $T_c$ is selected so that the sample time of the delay line is centered within the synchronous rectifier on-time to reduce the noise associated with the switching of the synchronous rectifier switch.

Figure 13:
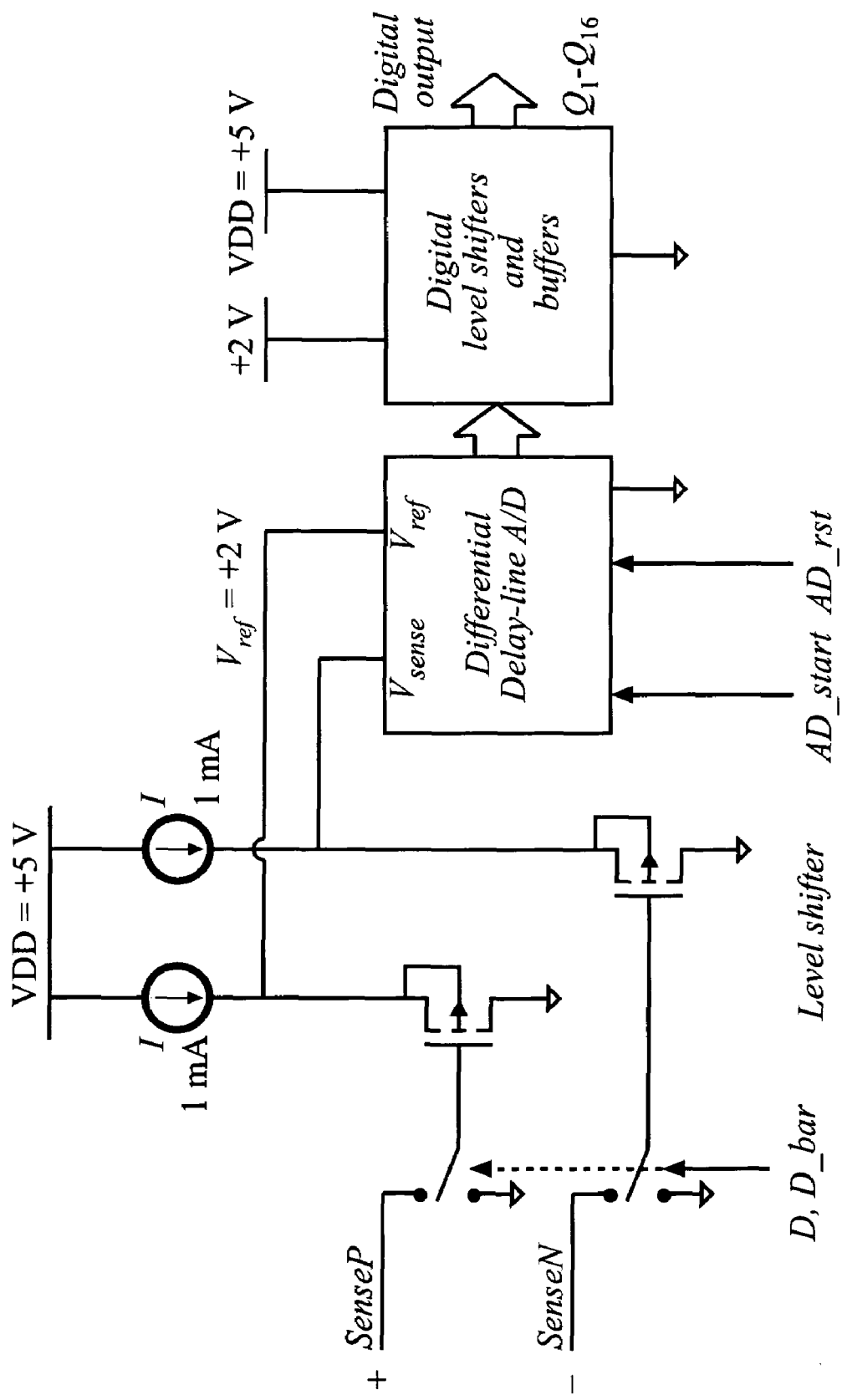
FIG. 13 shows a block diagram of an alternative current-sensing application of a differential delay-line A/D converter.

FIG. 13 shows a block diagram of an alternative current-sensing application of a differential delay-line A/D converter. As shown in FIG. 13, a $V_{sense}$ input and a $V_{ref}$ input of the A/D converter are coupled to a drain and a source of a synchronous rectifier power switch, respectively. Each input is coupled to the switch via a gating switch as described above with respect to FIGS. 6 and 11 as well as via a level shifter circuit, for which the operation is described above in more detail with respect to FIG. 5. The level shifter circuits shift the sensed voltages to a level (e.g., about 1.92 V to about 2V) that is more efficient for the differential delay-line A/D converter.

In addition, the digital output of the differential delay-line A/D converter is forwarded to digital level shifters and buffer module that shift the digital output values of the converter to standard logic levels in the integrated circuit technology (e.g., to standard CMOS or standard TTL levels) and outputs the shifted output levels $Q_1, Q_2, \ldots, Q_N$, such as to a digital compensator of a DC-DC controller.

In one embodiment, for example, the sensed voltage of the drain of the synchronous rectifier switch $V_{senseN}$ varies from about –80 mV to about 0 V, and sensed voltage of the source $V_{senseP}$ is generally stable at about 0 V. The primary and reference delay lines each include N=181 delay cells, and the converter has a target LSB resolution of about $V_q=5$ mV. A bias voltage is applied such that the voltage reference is about $V_{ref}=2$ V and a conversion time of about $T_c=250$ ns.

Figure 14:
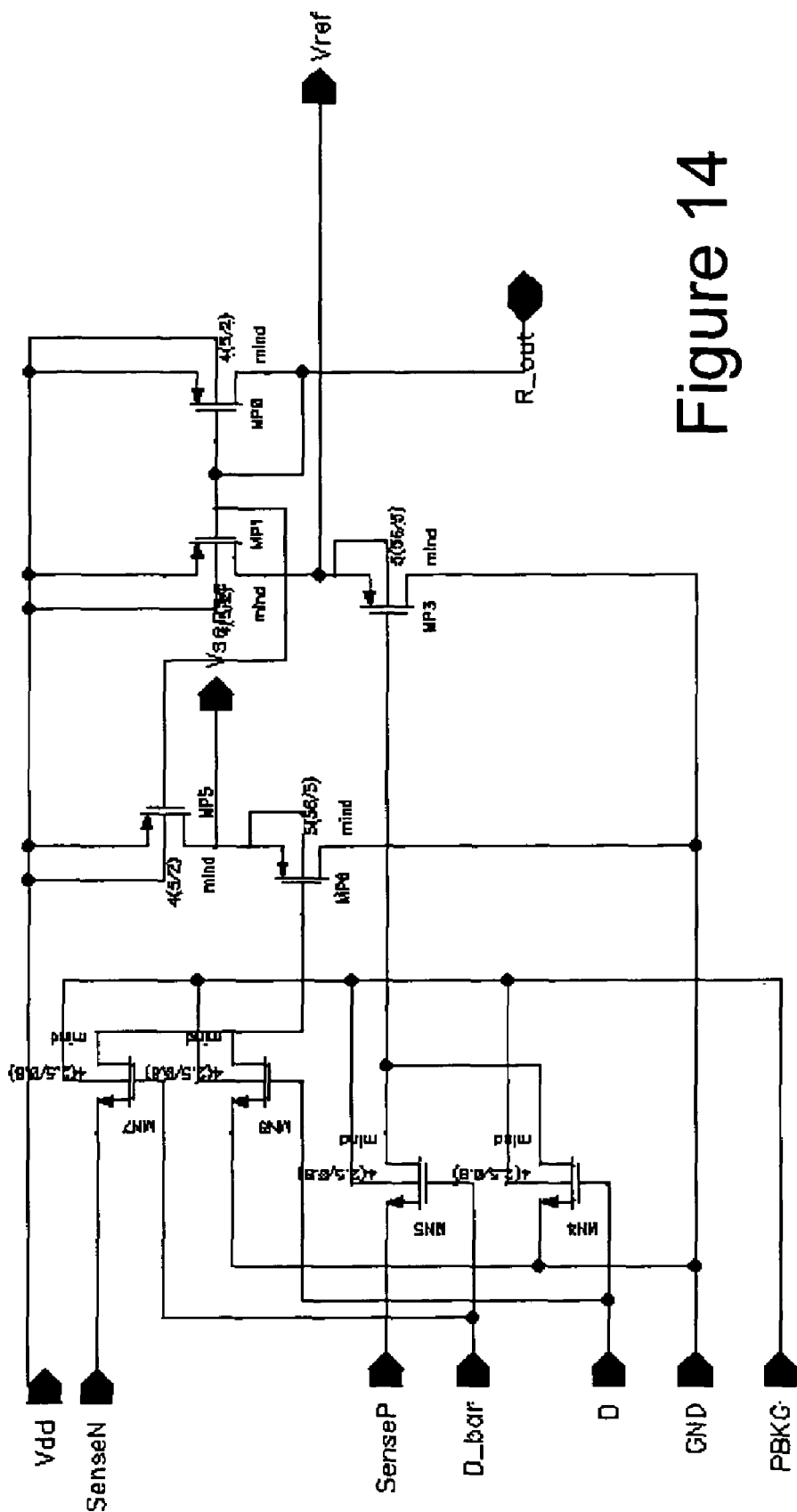
FIG. 14 shows a schematic diagram of an exemplary level-shifter circuit.

FIG. 14 shows a schematic diagram of an exemplary level-shifter circuit in which interleaved PMOS source followers are provided for improved match and low output impedance. The reference voltage $V_{ref}$ tracks process and temperature threshold variations. In one embodiment, for example, the level-shifter circuit provides a gain of about 0.9, a bandwidth (with a capacitive load at the $V_{ref}$ and $V_{sense}$ outputs) of about 2.3 MHz with a 200 pF load and about 13 MHz with a 30 pF load.

Figure 15:
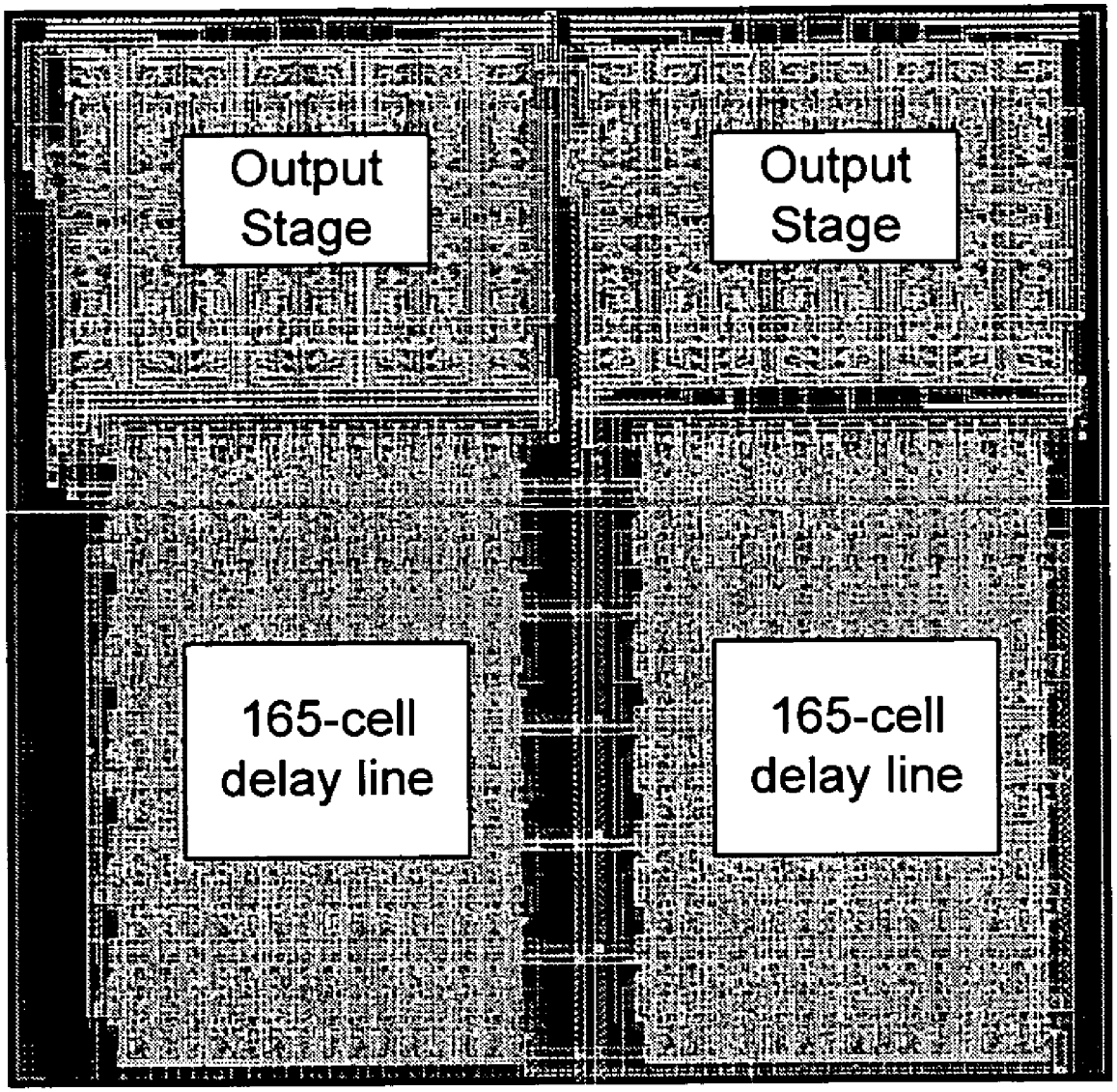
FIG. 15 shows an exemplary chip layout of a differential delay-line A/D converter.

FIG. 15 shows an exemplary chip layout of a differential delay-line A/D converter comprising a primary delay line disposed adjacent to a reference delay line on a single integrated circuit. In the exemplary layout, an output stage (e.g., 16 delay cells and 16 D flip-flops to latch the output) of each delay line is disposed adjacent to a delay-line stage (e.g., a 165 cell delay line) for the respective delay line. The reference delay line comprises an identical mirror image of the primary reference line. In one embodiment, for example, the converter may be implemented in a total area of about 0.29 mm2 in a 0.8µ CMOS technology.

Figure 16:
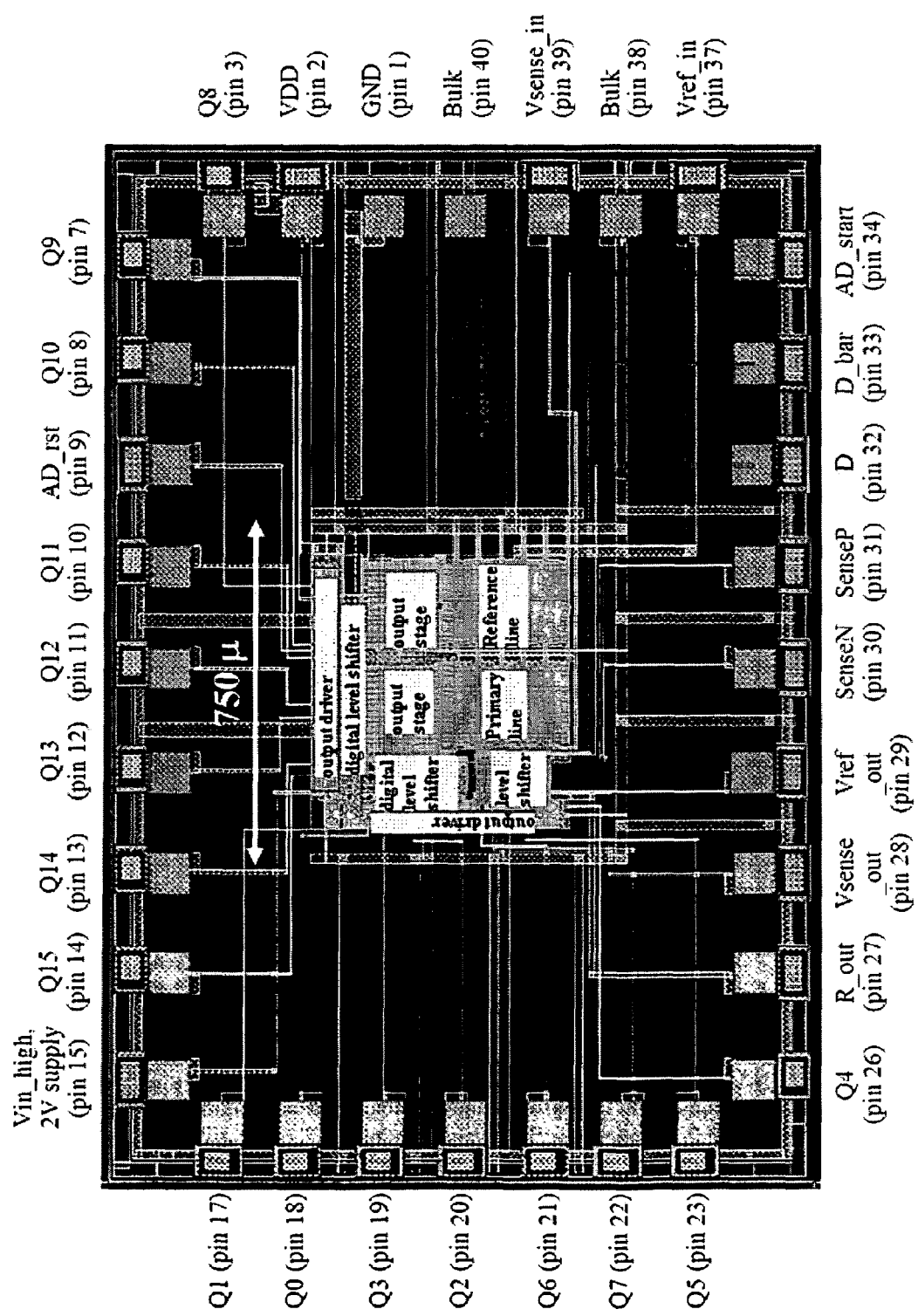
FIG. 16 shows a layout diagram of an exemplary current-sensing A/D test chip.

FIG. 16 shows a layout diagram of an exemplary current-sensing A/D test chip in which the test chip comprises the primary and secondary delay lines shown in FIG. 16 as well as input pins, output pins, an input level shifter, a first output driver for driving output pins $Q_0$ to $Q_7$, a second output driver for driving output pins $Q_8$ to $Q_{15}$, a first output digital level shifter for shifting digital output signals $Q_0$ to $Q_7$, and a second output digital level shifter for shifting digital output signals $Q_8$ to $Q_{15}$.

Figure 17:
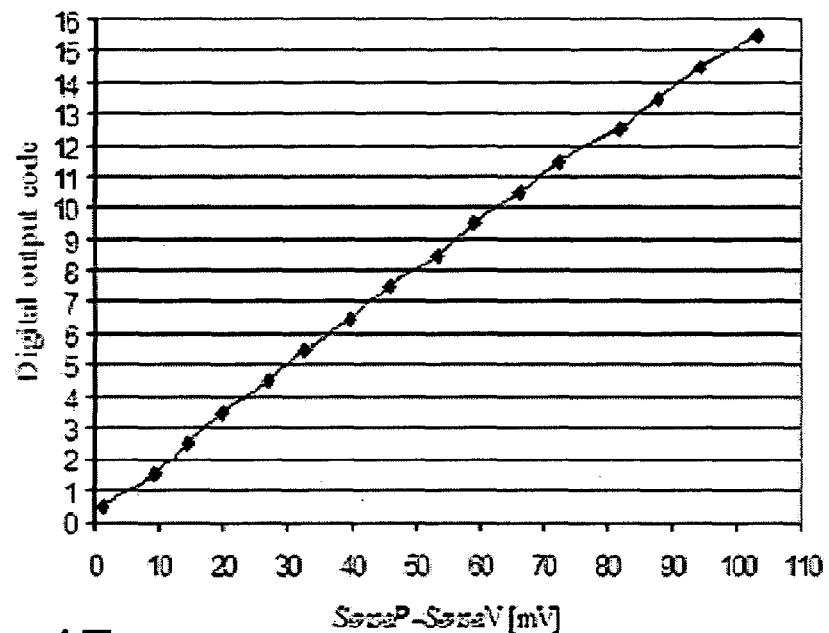
FIG. 17 shows a static conversion characteristic of an exemplary differential delay-line A/D converter in which a digital output code of the converter is shown for a sensed difference $V_{senseP} - V_{senseN}$.
Figure 18:
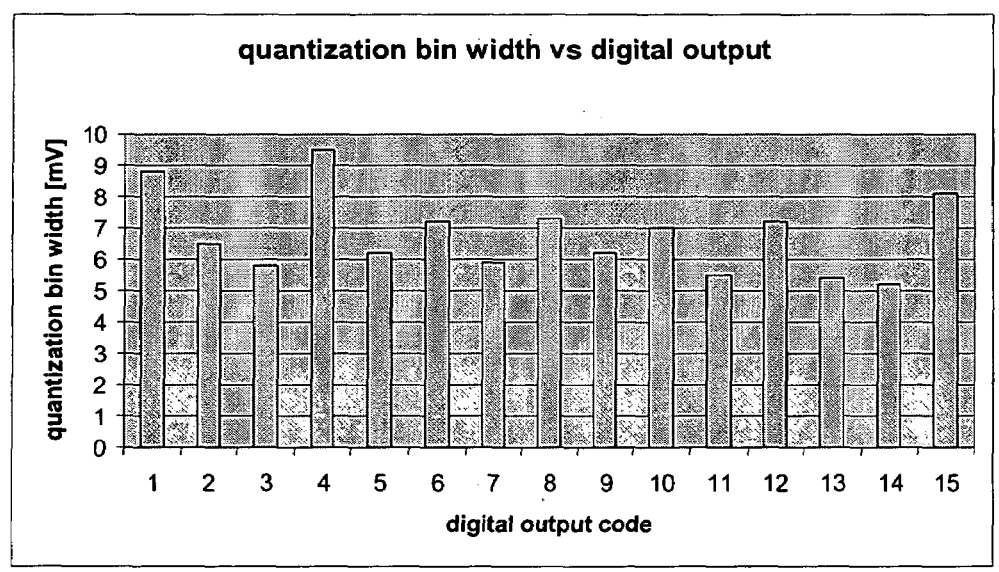
FIG. 18 shows experimental results for an exemplary differential delay-line A/D converter.

FIG. 17 shows a static conversion characteristic of a differential delay-line A/D converter in which a digital output code of the converter is shown for a sensed difference $V_{senseP}-V_{senseN}$. FIG. 17, for example, shows digital versus analog switching points of the A/D converter. FIG. 18 shows experimental results for an exemplary differential delay-line A/D converter, i.e., a quantization bin width versus a digital output code of the converter. As shown in FIGS. 17 and 18, the converter provides no significant offset error and a zero input corresponds to a zero output. In addition, a quantization bin width of about 7 mV is provided. A full range of about 103 mV is appropriate for current-sensing applications. A monotonic thermometer code and a conversion time of about 238 ns are provided.

Calibration to a Reference

Figure 19:
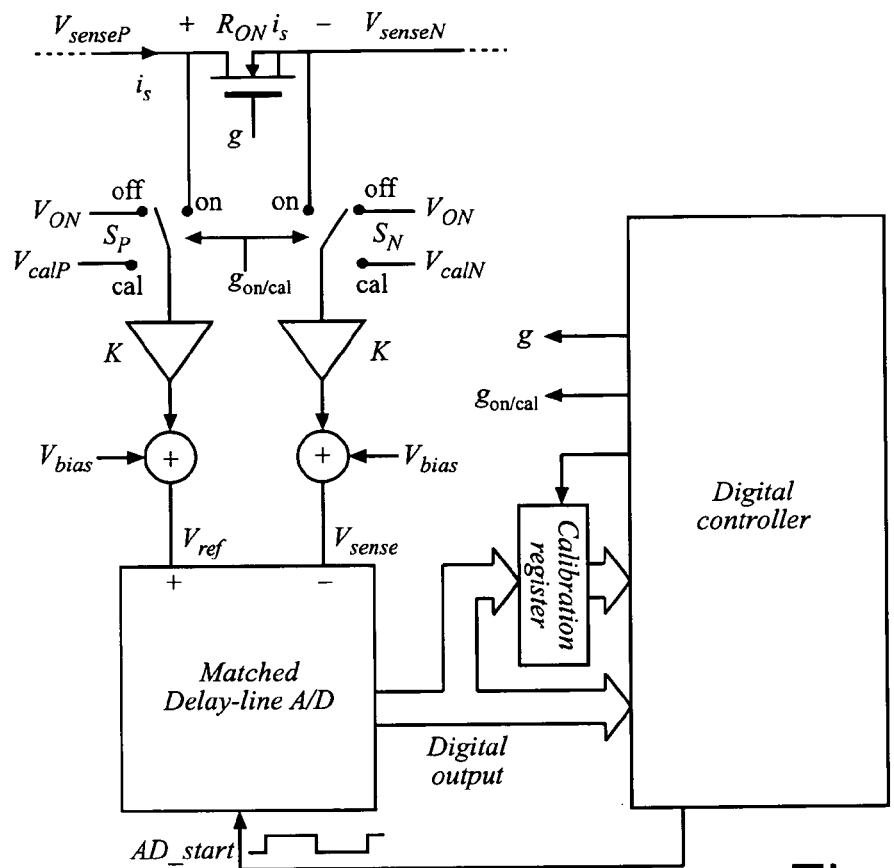
FIG. 19 shows a block diagram of an exemplary calibration system for calibrating a differential delay-line A/DC converter to a reference.

The differential delay-line A/D converter may also be calibrated to a reference, such as via a controller, to improve the accuracy of current sensing using the converter. Error due to offset, mismatch, temperature and/or process variations, or uncertainties in the sensing resistance $R_s$ or $R_{ON}$, for example can be reduced by calibrating the converter. FIG. 19 shows a block diagram of an exemplary calibration system for calibrating a differential delay-line A/DC converter to a reference. In this system, inputs of the A/D converter are switched to a reference by a digital controller. For example, the $V_{ref}$ and $V_{sense}$ inputs of the converter can be switched to known reference voltages $V_{calP}$ and $V_{calN}$, sense inputs $V_{senseP}$ and $V_{senseN}$ when the sensed current is has a known value, and/or alternative sense inputs across a known calibration resistance (see, e.g., Y. Zhang et al., "On-line Calibration of Lossless Current Sensing," IEEE Applied Power Electronics Conference, February 2004, which is incorporated by reference herein in its entirety as though fully set forth herein).

The controller stores the digital output value of the A/D converter obtained during a calibration cycle in a calibration register so that the controller can use this value to correct digital output values during normal operation. For example, by storing an output digital value corresponding to a maximum specified $V_{senseP}-V_{senseN}$ in the calibration register, the value can be used as a threshold for accurate overload protection.

Current-Sensing with Hysteresis

Figure 20:
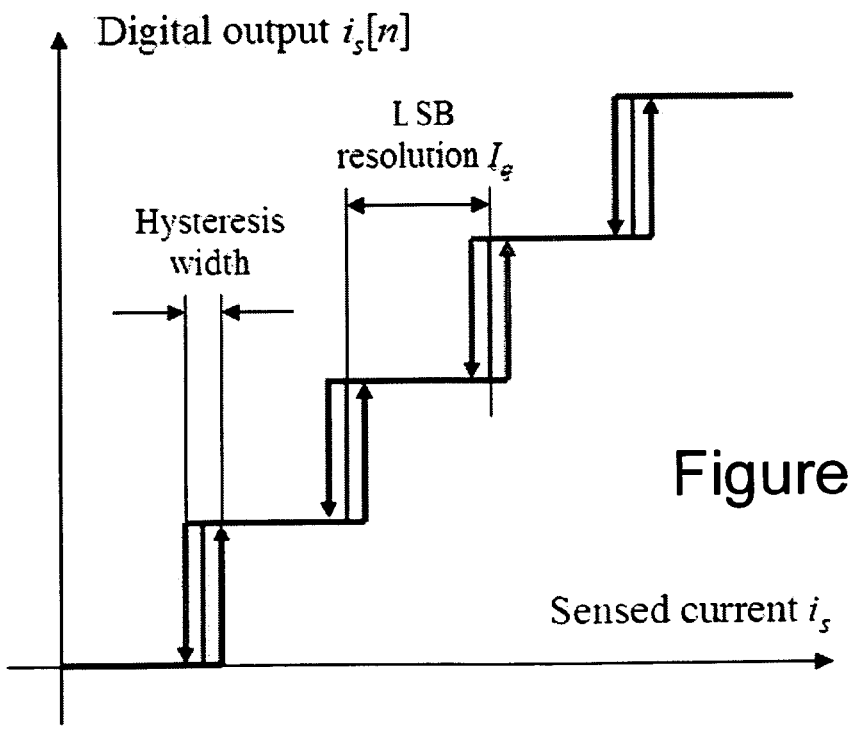
FIG. 20 shows a current-sensing A/D conversion characteristic with hysteresis.

In addition, current-sensing with hysteresis can be used with a differential delay-line A/D converter to improve noise immunity of the converter. FIG. 20, for example, shows a current-sensing A/D conversion characteristic with hysteresis that can be used to improve noise immunity and remove limit cycling oscillations due to code flipping between two adjacent values when the sensed current is close to a code boundary. An improved noise immunity is particularly useful in digitally controlled converters where the digital signal $i_s[n]$ representing a sensed current $i_s$ is used for control or protection purposes. The hysteresis can be added by extension to a current-sensing differential delay-line A/D converter including a small analog offset $V_h=\pm\Delta$ in one of the signal paths and a sign of the offset is be determined by a digital controller using a state machine, such as the one shown in FIG. 21.

Figure 21:
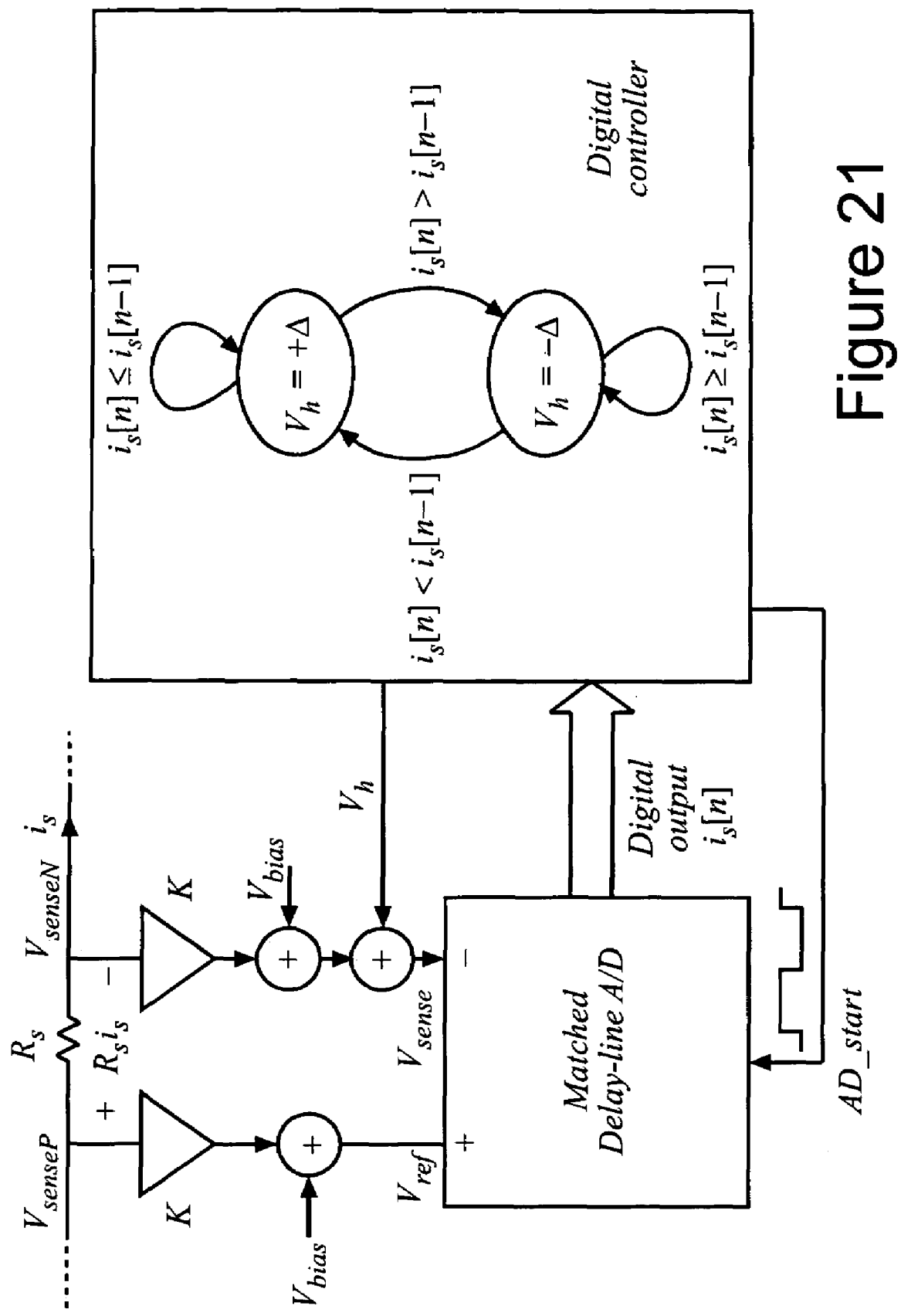
FIG. 21 shows an exemplary implementation of a differential delay-line A/D converter comprising a hysteresis state machine.

As shown in FIG. 21, an offset $V_h$ can be added as a switchable current source to an A/D converter circuit in parallel with a bias source I (see, e.g., FIG. 14). The switchable current source is controlled by a logic signal from the controller that implements the state machine shown in FIG. 20.

As shown in FIG. 20, the state machine can be implemented in a digital controller. When the system is in a first state (i.e., $V_h=+\Delta$), for example, the present sensed current i[n] is compared to a previous sensed current $i_s[n-1]$. If the present sensed current $i_s[n]$ is less than or equal to the previous sensed current $i_s[n-1]$, the controller keeps the analog offset in the same state (i.e., $V_h=+\Delta$). If the present sensed current $i_s[n]$ is greater than the previous sensed current $i_s[n-1]$, however, the controller changes states (i.e., $V_h=-\Delta$). When the system is in a second state (i.e., $V_h=-\Delta$), however, the present sensed current $i_s[n]$ is also compared to a previous sensed current $i_s[n-1]$. If, in this second state, the present sensed current $i_s[n]$ is greater than or equal to the previous sensed current $i_s[n-1]$, the controller keeps the analog offset in the same state (i.e., $V_h=-\Delta$). If the present sensed current i[n] is less than the previous sensed current $i_s[n-1]$, however, the controller changes states (i.e., $V_h=+\Delta$). The state machine shown in FIG. 20 is merely exemplary, however. One skilled in the art could readily implement a similar state machine to the one shown in FIG. 20. For example, the implication of the present sensed current being equal to the previous sensed current could be switched.

Power-Sensing Differential Delay-Line A/D Converter

On-line power sensing of an average power consumption of an electronic module (e.g., a switched-mode power supply, or a digital VLSI device such as a microprocessor) can enable implementation of on-line efficiency control or optimization techniques for switched-mode power supplies or adaptive power management techniques to minimize power consumption of a digital device (e.g., a microprocessor). For a switched-mode power supply, for example, one or more of switch dead-times, operating modes, switching frequency, gate-drive amplitude, sizes of power devices, and the like can be adjusted to control the efficiency of the power supply. For a digital device such as a microprocessor, for example, adaptive power techniques, such as selecting a clock frequency, supply voltage, body bias voltage, and/or higher-level (e.g., operating system or architectural) power-management techniques, can be used to control the power consumption of the device.

Figure 22:
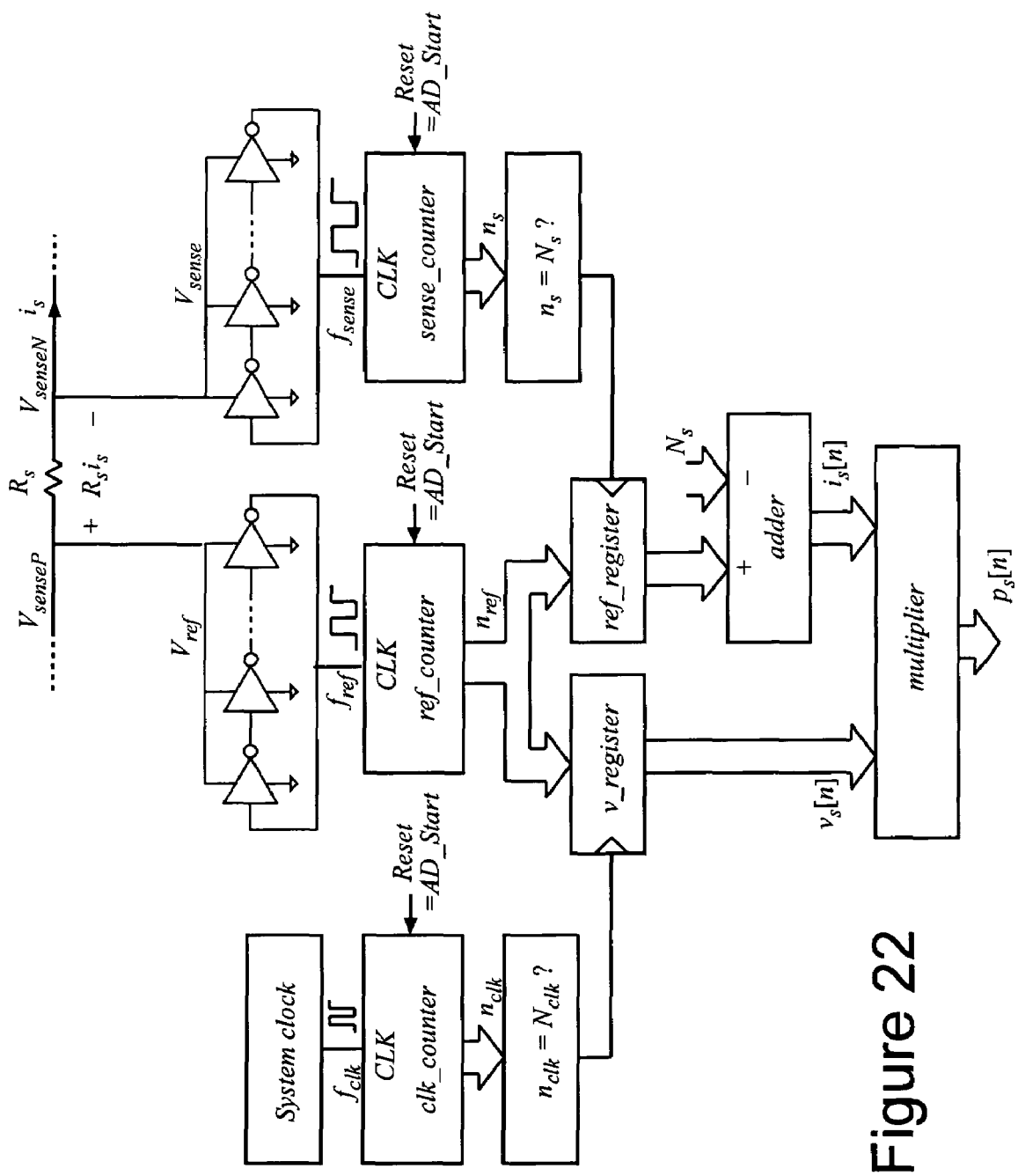
FIG. 22 shows a block diagram of an exemplary power-sensing differential delay-line A/D converter.

For on-line power sensing, increased resolution achieved by performing A/D conversion over longer time periods can be accomplished. For example, a folded version of a current-sensing matched delay-line A/D converter can be utilized to perform power sensing. FIG. 22, for example, shows a block diagram of an exemplary power-sensing differential delay-line A/D converter. The power-sensing differential delay-line A/D converter comprises a primary ring oscillator and a matched ring oscillator that are supplied by the sensed voltages $V_{senseP}$ and $V_{senseN}$ along a power distribution wire. The resistance of the power distribution wire is $R_s$. The power sensing starts by resetting three counters, a clock counter clk, a reference counter ref, and a sense counter sense. The clock counter clk is clocked by a constant-frequency clock (e.g., a crystal oscillator or phase locked loop (PLL)). The ref counter is clocked by the ring oscillator supplied from $V_{senseP}$, and the sense clock sense is clocked by the ring oscillator supplied from $V_{senseN}$.

When the sense count $n_s$ equals a predetermined value $N_s$, the ref count $n_{ref}$ is stored in a register, indicating the current consumption $i_s[n]$ after subtracting $N_s$. When the clock clk count $n_{clk}$ equals a present value $N_{clk}$, the ref count $n_{ref}$ is stored in a register, indicating the supply voltage level $v_s[n]$. Digital multiplication of the current consumption $i_s[n]$ and the supply voltage level $v_s[n]$ gives the sensed power $p_s[n]=i_s[n] \cdot v_s[n]$. On-line efficiency control (e.g., optimization) or power control (e.g., minimization) techniques can be implemented by adjusting (e.g., minimizing) the sensed power $p_s[n]$. For power minimization or efficiency optimization, for example, absolute accuracy of the power sensor may not be necessary. Monotonicity, however, can be ensured by construction.

In one implementation, the power-sensing circuit can be completely digital and implemented on digital chips, such as on the same integrated circuit or chip as one or more digital switched-mode power converter controllers or digital VLSI devices (e.g., microprocessors).

Although several embodiments of this invention have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A method of converting an analog input signal to an output digital current value, the method comprising:
   receiving a first input voltage and a second input voltage, wherein the first and second analog input voltage levels collectively represent a current;
   applying the first input voltage to a first delay line comprising a plurality of delay cells;
   applying the second input voltage to a second delay line comprising a plurality of cells, wherein the first and second delay lines are matched;
   propagating a signal through the first delay line and the second delay line;
   tapping a plurality of output signals of a corresponding plurality of delay cells of the first and second delay lines; and
   generating a digital output of the current represented by the first and second analog input voltage levels based upon the plurality of output signals.

2. The method of claim 1 further comprising biasing the first analog input voltage.

3. The method of claim 2 wherein the first analog input voltage is biased via level shifting.

4. The method of claim 2 wherein the first analog input voltage is biased via scaling.

5. The method of claim 2 wherein a biasing voltage sets a conversion time based upon a resolution.

6. The method of claim 1 further comprising gating the first input voltage.

7. The method of claim 6 wherein the gating of the first input voltage is synchronously gated with an on-time of a sampling transistor.

8. The method of claim 7 wherein the sampling transistor comprises a power switch of a switched-mode power supply.

9. The method of claim 7 wherein the sampling transistor comprises a synchronous rectifier switch of a synchronous power converter.

10. The method of claim 7 wherein a conversion time is approximately centered within the on-time of the sampling transistor.

11. The method of claim 1 further comprising level shifting the digital output.

12. The method of claim 1 wherein the operation of generating a digital output comprises sampling and holding the digital output.

13. The method of claim 1 wherein the first input voltage comprises a first calibration reference voltage and the second input voltage comprises a second calibration reference voltage.

14. The method of claim 13 further comprising storing the digital output generated from the first and second calibration reference voltages.

15. The method of claim 14 further comprising using the stored digital output to correct another digital output.

16. The method of claim 1 wherein an offset is added to the second input voltage.

17. The method of claim 16 wherein the offset is added to the second input voltage based upon a comparison of the digital output to a previous digital output.

18. The method of claim 1 wherein the digital output is stored.

19. The method of claim 18 further comprising determining a voltage digital output.

20. The method of claim 19 further comprising determining a power digital output by digitally multiplying the stored digital output and the voltage digital output.

21. The method of claim 1 wherein the digital output comprises a thermometer code.

22. The method of claim 21 wherein the digital output is further encoded to provide another digital code format.

23. An analog-to-digital converter comprising:
   a source of a first input voltage;
   a source of a second input voltage, wherein the first input voltage and the second input voltage collectively represent a current;
   a primary delay line connected to said source of a first input voltage, and comprising a delay signal input and a plurality of tap outputs;
   a secondary delay line connected to said source of a second input voltage and comprising a timer signal input and a timer signal output;
   a delay signal source connected to said delay signal input and said timer delay signal input, and
   a digital output circuit coupled to said tap outputs and said timer signal output to provide a digital output indicative of the current represented by the first input voltage and the second input voltage.

24. The analog-to-digital converter of claim 23 further comprising a first biasing circuit connected to said source of a first input voltage for biasing the first input voltage, and a second biasing circuit connected to said source of a second input voltage for biasing the second input voltage.

25. The analog-to-digital converter of claim 24 wherein the first biasing circuit comprises a first level shifter circuit and the second biasing circuit comprises a second level shifter circuit.

26. The analog-to-digital converter of claim 24 wherein the first biasing circuit comprises a first analog scaling circuit and the second biasing circuit comprises a second analog scaling circuit.

27. The analog-to-digital converter of claim 23 further comprising a gating transistor connected to said source of a first input voltage.

28. The analog-to-digital converter of claim 27 wherein said gating transistor is configured to be synchronously gated with a sampling transistor.

29. The analog-to-digital converter of claim 23 further comprising a level shifting circuit connected to said digital output circuit to level shift the digital output.

30. The analog-to-digital converter of claim 23 wherein said digital output circuit comprises an array of flip-flop circuits.

31. The analog-to-digital converter of claim 23 wherein said digital output circuit comprises a gain calibration circuit.

32. The analog-to-digital converter of claim 31 further comprising a calibration register for storing a calibration digital output.

33. The analog-to-digital converter claim 23 further comprising an offset circuit connected to said source of a second input voltage for adding an offset to the second input voltage.

34. The analog-to-digital converter of claim 33 further comprising a controller configured to control said offset circuit to add the offset to the second input voltage based upon a comparison of the digital output to a previous digital output.

35. The analog-to-digital converter of claim 23 wherein said digital output circuit is configured to provide the digital output in a thermometer code format.

36. The analog-to-digital converter of claim 35 wherein the digital output circuit comprises an encoder to convert the digital output into another digital code format.

37. An analog-to-digital converter comprising:
a source of a first input voltage;
a source of a second input voltage;
a primary ring oscillator connected to said source of a first input voltage;
a secondary ring oscillator connected to said source of a second input voltage;
a clock counter connected to a first clock to provide a clock count based upon the first clock;
a reference counter connected to the primary ring oscillator to provide a reference count;
a sense counter connected to the secondary ring oscillator to provide a sense count;
a register for storing a first count and a voltage count;
a controller configured to perform the following operations:
 reset the clock counter, the reference counter, and the sense counter;
 store the reference count as the first count in said register when the sense clock reaches a first predetermined value;
 store the reference clock as the voltage count in said register when said clock count reaches a second predetermined value;
 subtract the first predetermined value from the first count to provide a current count; and
 digitally multiply the current count and the voltage count to provide a power value.

38. The analog-to-digital converter of claim 37 wherein said register comprises a first register for storing the first count and a second register for storing the voltage count.

39. The analog-to-digital converter of claim 37 wherein said converter is implemented entirely with digital logic gates.

40. The analog-to-digital converter of claim 37 wherein said converter comprises no analog components.

41. The analog-to-digital converter of claim 39 wherein said converter is integrated on a single integrated chip with a microprocessor.

42. The analog-to-digital converter of claim 37 wherein said primary ring oscillator comprises a folded delay line.

43. The analog-to-digital converter of claim 42 wherein said secondary ring oscillator comprises a folded delay line.

* * * * *